(12) United States Patent
Yokoi

(10) Patent No.: US 10,676,554 B2
(45) Date of Patent: Jun. 9, 2020

(54) POLYMER COMPOUND, FILM OBTAINED BY HARDENING THIS POLYMER COMPOUND AND ELECTRONIC DEVICE COMPRISING THIS FILM

(71) Applicant: SUMITOMO CHEMICAL COMPANY, LIMITED, Tokyo (JP)

(72) Inventor: Yuki Yokoi, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/328,888

(22) PCT Filed: Aug. 28, 2017

(86) PCT No.: PCT/JP2017/030665
§ 371 (c)(1),
(2) Date: Feb. 27, 2019

(87) PCT Pub. No.: WO2018/043371
PCT Pub. Date: Mar. 8, 2018

(65) Prior Publication Data
US 2019/0211123 A1   Jul. 11, 2019

(30) Foreign Application Priority Data
Sep. 2, 2016   (JP) .................................. 2016-171545

(51) Int. Cl.
*C08F 212/14*   (2006.01)
*C08G 18/62*   (2006.01)
(Continued)

(52) U.S. Cl.
CPC .......... *C08F 212/14* (2013.01); *C08F 212/08* (2013.01); *C08F 220/20* (2013.01);
(Continued)

(58) Field of Classification Search
None
See application file for complete search history.

(56) References Cited

U.S. PATENT DOCUMENTS

2011/0193071 A1   8/2011   Yahagi
2015/0194312 A1*  7/2015   Someya .................. G03F 7/094
                                                 438/703
(Continued)

FOREIGN PATENT DOCUMENTS

JP   2011038062 A   2/2011
WO   2010/024238 A1   3/2010
(Continued)

OTHER PUBLICATIONS

International Search Report of PCT/JP2017/030665 dated Nov. 28, 2017.
(Continued)

*Primary Examiner* — Benjamin P Sandvik
(74) *Attorney, Agent, or Firm* — Sughrue Mion, PLLC

(57) ABSTRACT

A polymer compound comprising
a repeating unit having at least one group selected from the group consisting of a blocked isocyanato group and a blocked isothiocyanato group,
a repeating unit having at least one group selected from the group consisting of a hydroxy group and a carboxy group and
a repeating unit represented by the following formula (1), wherein
the content of the repeating unit having at least one group selected from the group consisting of a blocked isocyanato group and a blocked isothiocyanato group in the polymer compound is 1% by mol or more and 30% by mol or less when the total content of all repeating
(Continued)

units contained in the above-described polymer compound is taken as 100% by mol:

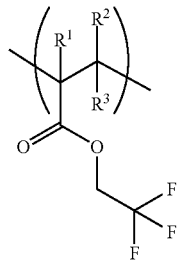

(1)

in the formula (1), $R^2$, $R^2$ and $R^3$ each independently represent a hydrogen atom or a methyl group.

10 Claims, 2 Drawing Sheets

(51) Int. Cl.

| | |
|---|---|
| *C08F 220/20* | (2006.01) |
| *C08F 220/22* | (2006.01) |
| *C09D 125/14* | (2006.01) |
| *C09D 175/04* | (2006.01) |
| *C08F 212/08* | (2006.01) |
| *C08G 18/80* | (2006.01) |
| *C08F 220/36* | (2006.01) |
| *H01L 51/05* | (2006.01) |
| *C08F 220/24* | (2006.01) |
| *C08F 12/22* | (2006.01) |

(52) U.S. Cl.
CPC .......... *C08F 220/22* (2013.01); *C08F 220/24* (2013.01); *C08F 220/36* (2013.01); *C08G 18/62* (2013.01); *C08G 18/80* (2013.01); *C08G 18/807* (2013.01); *C09D 125/14* (2013.01); *C09D 175/04* (2013.01); *H01L 51/052* (2013.01); *H01L 51/0512* (2013.01); *C08F 12/22* (2013.01)

(56) References Cited

U.S. PATENT DOCUMENTS

| | | | | |
|---|---|---|---|---|
| 2016/0369025 | A1* | 12/2016 | Yukawa | C08F 212/08 |
| 2017/0045818 | A1 | 2/2017 | Karasawa et al. | |
| 2019/0085130 | A1* | 3/2019 | Yukawa | C09D 133/16 |

FOREIGN PATENT DOCUMENTS

| | | |
|---|---|---|
| WO | 2011/065207 A1 | 6/2011 |
| WO | 2015/178235 A1 | 11/2015 |
| WO | 2017/086213 A1 | 5/2017 |

OTHER PUBLICATIONS

Machine Translation of WO 2017/086213 A1 dated May 26, 2017.
Machine Translation of WO 2011/065207 A1 dated Jun. 3, 2011.
Communication dated Apr. 3, 2018 from the Japanese Patent Office in application No. 2017-567823.

\* cited by examiner

[Fig. 1]
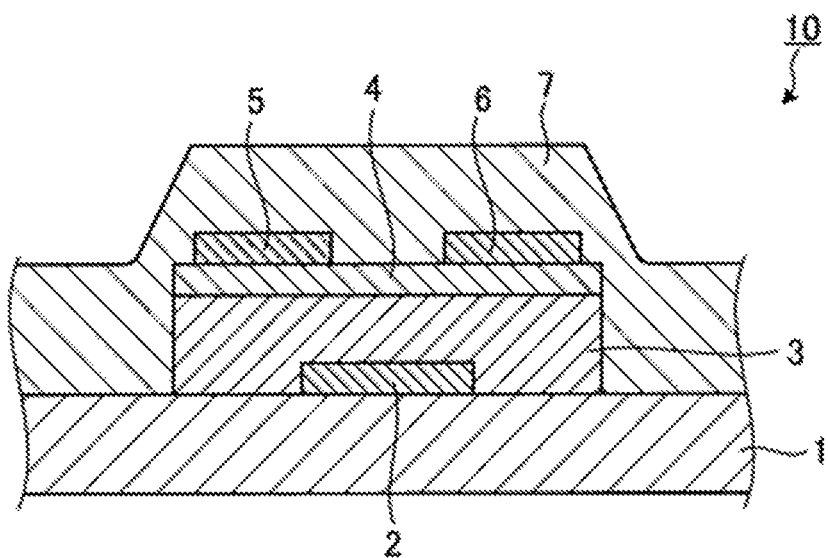

[Fig. 2]
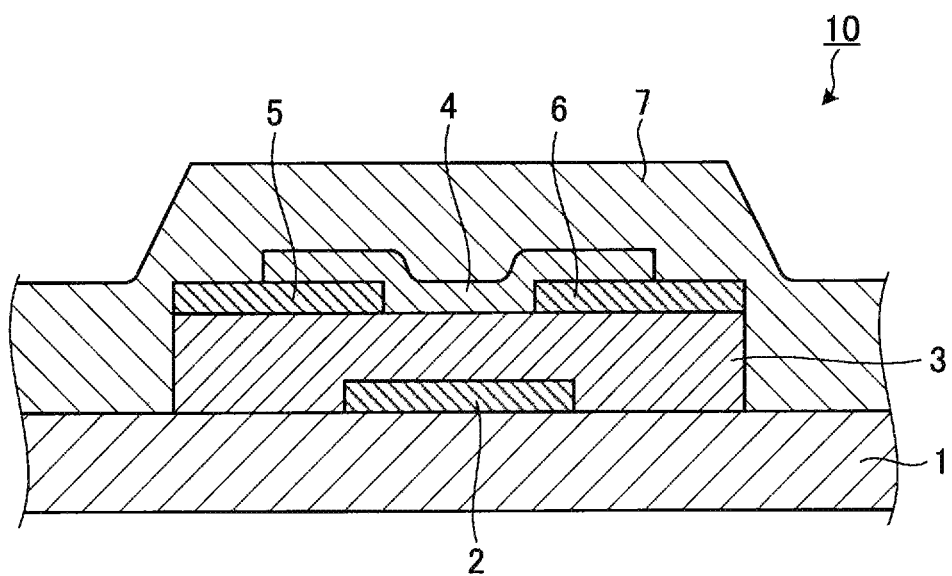

POLYMER COMPOUND, FILM OBTAINED BY HARDENING THIS POLYMER COMPOUND AND ELECTRONIC DEVICE COMPRISING THIS FILM

CROSS REFERENCE TO RELATED APPLICATIONS

This application is a National Stage of International Application No. PCT/JP2017/030665 filed Aug. 28, 2017, claiming priority based on Japanese Patent Application No. 2016-171545 filed Sep. 2, 2016.

TECHNICAL FIELD

The present invention relates to a polymer compound, a film obtained by hardening the polymer compound and an electronic device comprising the film.

BACKGROUND ART

As a driving device for driving a luminous device such as an organic electroluminescent device (organic EL device), an organic thin film field effect transistor (organic thin film transistor) in which voltage applied to a gate electrode (gate voltage) acts on an organic semiconductor layer via a gate insulating layer to control ON/OFF of a drain current is attracting attention.

For example, the following Patent Document 1 describes an organic thin film field effect transistor having a gate insulation layer formed by using a resin composition containing (A) a polymer compound containing a repeating unit containing a fluorine atom and a repeating unit containing a functional group generating a second functional group reacting with active hydrogen by the action of electromagnetic wave or heat, and (B) at least one compound selected from the group consisting of a low molecular compound containing two or more active hydrogen atoms in the molecule and a polymer compound containing two or more active hydrogen atoms in the molecule; a gate electrode and an organic semiconductor layer.

PRIOR ART DOCUMENT

Patent Document

Patent Document 1: Japanese Unexamined Patent Application Publication No. 2011-38062

SUMMARY OF THE INVENTION

Problem to be Solved by the Invention

In recent years, it has been demanded to further improve the carrier mobility of an organic thin film transistor.

The present invention has an object of providing a polymer compound capable of giving a gate insulation layer which can further improve the carrier mobility of an organic thin film transistor.

Means for Solving the Problem

The present invention is as described below.
[1] A polymer compound comprising
a repeating unit having at least one group selected from the group consisting of a blocked isocyanato group and a blocked isothiocyanato group,
a repeating unit having at least one group selected from the group consisting of a hydroxy group and a carboxy group and
a repeating unit represented by the following formula (1), wherein
the content of the repeating unit having at least one group selected from the group consisting of a blocked isocyanato group and a blocked isothiocyanato group in the polymer compound is 1% by mol or more and 30% by mol or less when the total content of all repeating units contained in the above-described polymer compound is taken as 100% by mol:

[chemical formula 1]

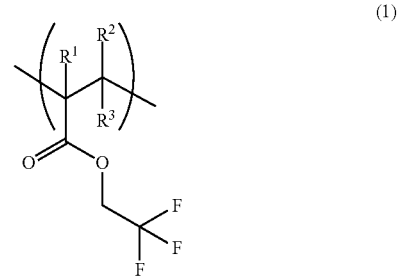

(1)

in the formula (1), $R^2$, $R^2$ and $R^3$ each independently represent a hydrogen atom or a methyl group.

[2] The polymer compound according to [1], wherein the content of the above-described repeating unit represented by the formula (1) is 40% by mol or more when the total content of all repeating units contained in the above-described polymer compound is taken as 100% by mol.

[3] The polymer compound according to [1] or [2], wherein the above-described repeating unit having at least one group selected from the group consisting of a hydroxy group and a carboxy group is a repeating unit represented by the following formula (2):

[chemical formula 2]

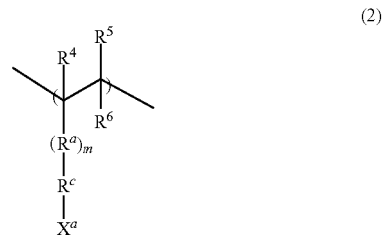

(2)

in the formula (2),
$R^4$, $R^5$ and $R^6$ each independently represent a hydrogen atom, a fluorine atom or a monovalent organic group having a number of carbon atoms of 1 to 20,
$R^a$ represents a divalent organic group having a number of carbon atoms of 1 to 20, a group represented by —O—, a group represented by —CO—, a group represented by —COO—, a group represented by —NHCO— or a group represented by —NHCOO—; and a connecting bond of the above-described group represented by —O—, the above-described group represented by —CO—, the above-described group represented by —COO—, the above-described group represented by —NHCO— and the above-described group represented by —NHCOO— may be located on the carbon atom side to which the above-described $R^4$ is bonded in the above-described formula (2) or may be located on the $R^c$ side in the above-described formula (2), $R^c$ represents a single bond or a divalent organic group having a number of carbon atoms of 1 to 20, a hydrogen atom in the above-described divalent organic group may be substituted with a fluorine atom, m represents an integer of 0 to 6, $X^a$ represents a hydroxy group or a carboxy group, and when a plurality of $R^a$ are present, they are independent of each other.

[4] The polymer compound according to any one of [1] to [3], wherein the above-described blocked isocyanato group and the above-described blocked isothiocyanato group are each a group represented by the following formula (3) or a group represented by the following formula (4):

[chemical formula 3]

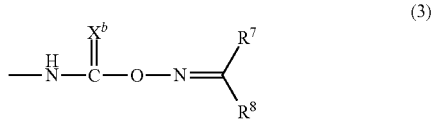

(3)

[chemical formula 4]

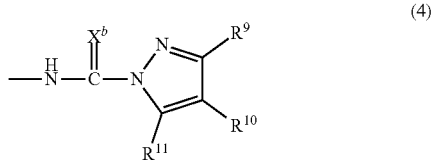

(4)

in the formulae (3) and (4), $X^b$ represents an oxygen atom or a sulfur atom and $R^7$ to $R^{11}$ each independently represent a hydrogen atom or a monovalent organic group having a number of carbon atoms of 1 to 20.

[5] The polymer compound according to any one of [1] to [4], further comprising a repeating unit represented by the following formula (5):

[chemical formula 5]

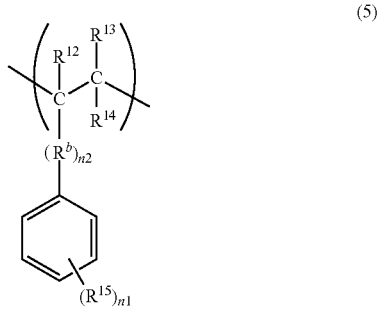

(5)

in the formula (5), $R^{12}$, $R^{13}$ and $R^{14}$ each independently represent a hydrogen atom, a fluorine atom or a monovalent organic group having a number of carbon atoms of 1 to 20, $R^{15}$ represents a chlorine atom, a fluorine atom, a bromine atom, an iodine atom or a monovalent organic group having a number of carbon atoms of 1 to 20, $R^b$ represents a divalent organic group having a number of carbon atoms of 1 to 20, a group represented by —O—, a group represented by —CO—, a group represented by —COO—, a group represented by —NHCO— or a group represented by —NHCOO—; a connecting bond of the above-described group represented by —O—, the above-described group represented by —CO—, the above-described group represented by —COO—, the above-described group represented by —NHCO— and the above-described group represented by —NHCOO— may be located on the carbon atom side to which the above-described $R^{12}$ is bonded in the above-described formula (5) or may be located on the carbon atom side constituting a benzene ring in the above-described formula (5); a hydrogen atom in the above-described divalent organic group may be substituted with a fluorine atom, n1 represents an integer of 0 to 5, n2 represents an integer of 0 to 6, When a plurality of $R^b$ are present, they are independent of each other, and when a plurality of $R^{15}$ are present, they are independent of each other.

[6] A composition comprising the polymer compound according to any one of [1] to [5] and an organic solvent.

[7] A film obtained by hardening the polymer compound according to any one of [1] to [5].

[8] An electronic device comprising the film according to [7].

[9] An organic thin film transistor comprising the film according to [7] as a gate insulation layer.

[10] The organic thin film transistor according to [9], further comprising the film according to [7] as an overcoat layer.

BRIEF EXPLANATION OF DRAWINGS

FIG. 1 is a schematic view showing schematically the structure of a bottom gate top contact type organic thin film transistor according to a first embodiment of the present invention.

FIG. 2 is a schematic view showing schematically the structure of a bottom gate bottom contact type organic thin film transistor according to a second embodiment of the present invention.

MODES FOR CARRYING OUT THE INVENTION

Next, embodiments of the present invention will be described in more detail. It is to be noted that the drawings referred to are schematically shown only in shape, size and arrangement of components to the extent that the invention can be understood. The present invention is not limited by the following description, and each component can be appropriately changed without departing from the gist of the present invention. In the drawings used for explanation, the same components are denoted by the same reference numerals, and overlapping explanations may be omitted in some cases. Further, the configuration according to the embodiment of the present invention is not necessarily manufactured or used with the arrangement shown in the drawings.

In the present specification, "polymer compound" means a compound independently containing a plurality of structural units (repeating units) in the molecule, and so-called a dimer is also included in "polymer compound". In the present specification, "low molecular compound" means compound which does not contain a plurality of structural units in the molecule.

Explanation of Common Terms

Terms commonly used in the present specification have the following meanings unless otherwise stated.

"Monovalent organic group having a number of carbon atoms of 1 to 20" may be any of linear, branched or cyclic, and may be saturated or unsaturated.

The monovalent organic group having a number of carbon atoms of 1 to 20 includes, for example, a linear hydrocarbon group having a number of carbon atoms of 1 to 20, a branched hydrocarbon group having a number of carbon atoms of 3 to 20, a cyclic hydrocarbon group having a number of carbon atoms of 3 to 20, an aromatic hydrocarbon group having a number of carbon atoms of 6 to 20, an arylalkyl group having a number of carbon atoms of 7 to 20, an alkoxy group having a number of carbon atoms of 1 to 20, an allyloxy group having a number of carbon atoms of 6 to 20, an acyl group having a number of carbon atoms of 2 to 20, an alkoxycarbonyl group having a number of carbon atoms of 2 to 20, an allyloxycarbonyl group having a number of carbon atoms of 7 to 20 and an arylalkyl group having a number of carbon atoms of 7 to 20, preferably includes a linear hydrocarbon group having a number of carbon atoms of 1 to 6, a branched hydrocarbon group having a number of carbon atoms of 3 to 6, a cyclic hydrocarbon group having a number of carbon atoms of 3 to 6, an aromatic hydrocarbon group having a number of carbon atoms of 6 to 20, an alkoxy group having a number of carbon atoms of 1 to 6, an allyloxy group having a number of carbon atoms of 7 to 20, an acyl group having a number of carbon atoms of 2 to 7, an alkoxycarbonyl group having a number of carbon atoms of 2 to 7, an allyloxycarbonyl group having a number of carbon atoms of 7 to 20 and an arylalkyl group having a number of carbon atoms of 7 to 20 and the like.

In the linear hydrocarbon group having a number of carbon atoms of 1 to 20, the branched hydrocarbon group having a number of carbon atoms of 3 to 20, the cyclic hydrocarbon group having a number of carbon atoms of 3 to 20, the aromatic hydrocarbon group having a number of carbon atoms of 6 to 20, the arylalkyl group having a number of carbon atoms of 7 to 20, the alkoxy group having a number of carbon atoms of 1 to 20, the allyloxy group having a number of carbon atoms of 1 to 20, the acyl group having a number of carbon atoms of 2 to 20, the alkoxycarbonyl group having a number of carbon atoms of 2 to 20, the allyloxycarbonyl group having a number of carbon atoms of 7 to 20 and the arylalkyl group having a number of carbon atoms of 7 to 20, and a hydrogen atom contained in these groups may be substituted by a halogen atom.

Specific examples of the monovalent organic group having a number of carbon atoms of 1 to 20 include a methyl group, an ethyl group, a propyl group, a butyl group, a pentyl group, a hexyl group, an isopropyl group, an isobutyl group, a tert-butyl group, a cyclopropyl group, a cyclobutyl group, a cyclopentyl group, a cyclohexyl group, a trifluoromethyl group, a trifluoroethyl group, a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methylanthryl group, an ethylanthryl group, a pentafluorophenyl group, a trifluoromethylphenyl group, a chlorophenyl group, a bromophenyl group, a methoxy group, an ethoxy group, a phenoxy group, an acetyl group, a benzoyl group, a methoxycarbonyl group, a phenoxycarbonyl group, a benzyl group and the like.

As the monovalent organic group having a number of carbon atoms of 1 to 20, alkyl groups are preferable.

"Divalent organic group having a number of carbon atoms of 1 to 20" may be any of linear, branched or cyclic, and may be an aliphatic hydrocarbon group or an aromatic hydrocarbon group. The divalent organic group having a number of carbon atoms of 1 to 20 includes, for example, a divalent linear aliphatic hydrocarbon group having a number of carbon atoms of 1 to 20, a divalent branched aliphatic hydrocarbon group having a number of carbon atoms of 3 to 20, a divalent cyclic hydrocarbon group having a number of carbon atoms of 3 to 20, and a divalent aromatic hydrocarbon group having a number of carbon atoms of 6 to 20 optionally substituted with a monovalent organic group or the like. Of them, a divalent linear aliphatic hydrocarbon group having a number of carbon atoms of 1 to 6, a divalent branched aliphatic hydrocarbon group having a number of carbon atoms of 3 to 6, a divalent cyclic hydrocarbon group having a number of carbon atoms of 3 to 6 and a divalent aromatic hydrocarbon group having a number of carbon atoms of 6 to 20 optionally substituted with an alkyl group or the like are preferable as the divalent organic group having a number of carbon atoms of 1 to 20.

Specific examples of the divalent aliphatic hydrocarbon group and the divalent cyclic hydrocarbon group include a methylene group, an ethylene group, a n-propylene group, an isopropylene group, a cyclopropylene group, a n-butylene group, an isobutylene group, a s-butylene group, a t-butylene group, a cyclobutylene group, a 1-methylcyclopropylene group, a 2-methylcyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a cyclopentylene group, a n-hexylene group, a 1-methyl-n-pentylene group, a cyclohexylene group, a 1-methylcyclopentylene group, a 2-methylcyclopentylene group, a 3-methylcyclopentylene group and the like.

Specific examples of the divalent aromatic hydrocarbon group having a number of carbon atoms of 6 to 20 include a phenylene group, a naphthylene group, an anthrylene group, a dimethylphenylene group, a trimethylphenylene group, an ethylenephenylene group, a diethylenephenylene group, a triethylenephenylene group, a propylenephenylene group, a butylenephenylene group, a methylnaphthylene group, a dimethylnaphthylene group, a trimethylnaphthylene group, a vinylnaphthylene group, an ethenylnaphthylene group, a methylanthrylene group, an ethylanthrylene group and the like.

"Halogen atom" is a fluorine atom, a chlorine atom, a bromine atom or an iodine atom.

<Polymer Compound>

The polymer compound according to the present invention is a polymer compound comprising a repeating unit having at least one group selected from the group consisting of a blocked isocyanato group and a blocked isothiocyanato group, a repeating unit having at least one group selected from the group consisting of a hydroxy group and a carboxy group and a repeating unit represented by the above-described formula (1), wherein the content of the repeating unit having at least one group selected from the group consisting of a blocked isocyanato group and a blocked isothiocyanato group in the polymer compound is 1% by mol or more and 30% by mol or less when the total content of all repeating units contained in the above-described polymer compound is taken as 100% by mol.

When the total content of all repeating units contained in the above-described polymer compound is taken as 100% by mol, the sum of the content a repeating unit having at least one group selected from the group consisting of a blocked isocyanato group and a blocked isothiocyanato group, the content a repeating unit having at least one group selected from the group consisting of a hydroxy group and a carboxy group and the content of a repeating unit represented by the formula (1) is preferably 40% by mol or more and 100% by mol or less, more preferably 50% by mol or more and 90% by mol or less, further preferably 50% by mol or more and 80% by mol or less.

The polymer compound of the present invention has at least one group selected from the group consisting of a blocked isocyanato group and a blocked isothiocyanato group in the monomer, as described above.

In the present specification, at least one group selected from the group consisting of a blocked isocyanato group and a blocked isothiocyanato group is referred to as "first functional group" in some cases. The first functional group does not react with active hydrogen. However, if electromagnetic wave or heat acts on the first functional group, at least one group selected from the group consisting of an isocyanato group and an isothiocyanato group (referred to as "second functional group" in some cases) is generated, and the generated second functional group can react with active hydrogen. That is, this first functional group is a functional group capable of generating a second functional group reacting with active hydrogen, by releasing of a protective group derived from a blocking agent by the action of electromagnetic wave or heat.

In the present specification, the active hydrogen denotes a hydrogen atom bonded to an atom other than a carbon atom such as an oxygen atom, a nitrogen atom and a sulfur atom.

The above-described first functional group is preferably a functional group which is released by a treatment with electromagnetic wave or a heating treatment to generate a second functional group, from the standpoint of maintaining the preservation stability of a composition described later.

The content of a repeating unit having at least one group selected from the group consisting of a blocked isocyanato group and a blocked isothiocyanato group and the content of a repeating unit having at least one group selected from the group consisting of a hydroxy group and a carboxy group, contained in the above-described polymer compound, are preferably 1/100 to 10000/100, more preferably 10/100 to 1000/100 in molar ratio, when the content (molar amount) of the repeating unit having at least one group selected from the group consisting of a hydroxy group and a carboxy group is taken as 100. The above-described contents are determined from the use amounts of raw material monomers used in producing the above-described polymer compound.

The polymer compound of the present invention has a weight-average molecular weight of preferably 3000 to 1000000, more preferably 5000 to 500000. The polymer compound may be any of linear, branched or cyclic.

(Repeating Unit Represented by the Formula (1))

The polymer compound of the present invention contains a repeating unit represented by the formula (1).

[chemical formula 6]

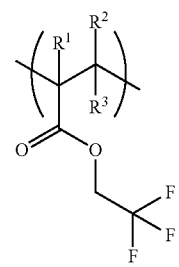

(in the formula (1), $R^1$, $R^2$ and $R^3$ each independently represent a hydrogen atom or a methyl group.)

In the above-described formula (1), $R^2$ and $R^3$ each independently represent preferably a hydrogen atom.

Examples of the monomer used as the raw material of the above-described repeating unit represented by the formula (1) include 2,2,2-trifluoroethyl acrylate, 2,2,2-trifluoroethyl methacrylate, 2,2,2-trifluoroethyl-β-methyl acrylate, 2,2,2-trifluoroethyl-β-methyl methacrylate and the like.

When the total content of all repeating units contained in the above-described polymer compound is taken as 100% by mol, the content of the above-described repeating unit represented by the formula (1) in the polymer compound is preferably 5% by mol or more and 95% by mol or less, more preferably 30% by mol or more and 90% by mol or less, further preferably 40% by mol or more and 80% by mol or less, from the standpoint of increasing the carrier mobility of an organic film transistor containing a film obtained by hardening the polymer compound. The contents of repeating units contained in the polymer compound are determined from the use amounts of raw material monomers corresponding to repeating units used in producing the polymer compound.

(Repeating Unit Having at Least One Group Selected from the Group Consisting of a Blocked Isocyanato Group and a Blocked Isothiocyanato Group)

The polymer compound of the present invention contains a repeating unit having at least one group selected from the group consisting of a blocked isocyanato group and a blocked isothiocyanato group.

In other words, the polymer compound of the present invention may contain a repeating unit having only a blocked isocyanato group, may contain a repeating unit having only a blocked isothiocyanato group, or may contain a repeating unit having both a blocked isocyanato group and a blocked isothiocyanato group. The above-described polymer compound may contain two or more repeating units selected from the group consisting of a repeating unit having only a blocked isocyanato group, a repeating unit having only a blocked isothiocyanato group and a repeating unit having both a blocked isocyanato group and a blocked isothiocyanato group.

The structure of the repeating unit having at least one group selected from the group consisting of a blocked isocyanato group and a blocked isothiocyanato group is based on the chemical structure of a monomer as a raw material thereof.

Examples of the monomer as the raw material of the repeating unit having at least one group selected from the group consisting of a blocked isocyanato group and a blocked isothiocyanato group are shown below.

Examples of the monomer as the raw material of the repeating unit having at least one group selected from the group consisting of a blocked isocyanato group and a blocked isothiocyanato group include monomers having at least one group selected from the group consisting of a blocked isocyanato group and a blocked isothiocyanato group and an unsaturated bond in the monomer.

The monomer having at least one group selected from the group consisting of a blocked isocyanato group and a blocked isothiocyanato group and an unsaturated bond in the monomer can be produced by reacting a compound having at least one group selected from the group consisting of an isocyanato group and an isothiocyanato group and an unsaturated bond in the monomer with a blocking agent. The unsaturated bond is preferably an unsaturated double bond.

Examples of the compound having an unsaturated double bond and an isocyanato group in the monomer include 2-acryloyloxyethylisocyanate, 2-methacryloyloxyethylisocyanate, 2-(2'-methacryloyloxyethyl)oxyethylisocyanate and the like.

Examples of the compound having an unsaturated double bond and an isothiocyanato group in the monomer include 2-acryloyloxyethylisothiocyanate, 2-methacryloyloxyethylisothiocyanate, 2-(2'-methacryloyloxyethyl)oxyethylisothiocyanate and the like.

Examples of the monomer having an unsaturated double bond and a blocked isocyanato group in the monomer include 2-[O-[1'-methylpropylideneamino]carboxyamino] ethyl methacrylate, 2-[N-[1',3'-dimethylpyrazolyl]carboxyamino]ethyl methacrylate, 2-[O-[1'-methylpropylideneamino]carboxyamino]ethyl acrylate, 2-[N-[1',3'-dimethylpyrazolyl]carboxyamino]ethyl acrylate and the like.

The blocked isocyanato group or the blocked isothiocyanato group can be generated, for example, by reacting a blocking agent having only one active hydrogen capable of reacting with an isocyanato group or an isothiocyanato group in one molecule of the blocking agent with a compound having an isocyanato group or an isothiocyanato group.

The blocking agent is preferably a compound capable of releasing a protective group from at least one group selected from the group consisting of a blocked isocyanato group and a blocked isothiocyanato group by heating at a temperature of 170° C. or lower or by irradiation with electromagnetic wave, even after reacting with at least one group selected from the group consisting of an isocyanato group and an isothiocyanato group.

The blocking agent includes, for example, alcohol compounds, phenol compounds, active methylene compounds, mercaptan compounds, acid amide compounds, acid imide compounds, imidazole compounds, urea compounds, oxime compounds, amine compounds, imine compounds, bisulfites, pyridine compounds and pyrazole compounds. These blocking agents may be used singly or in admixture of two or more kinds thereof. The preferable blocking agent includes oxime compounds and pyrazole compounds.

The applicable blocking agents are specifically shown below.

The alcohol compound includes, for example, methanol, ethanol, propanol, butanol, 2-ethylhexanol, methylcellosolve, butylcellosolve, methylcarbitol, benzyl alcohol, cyclohexanol and the like.

The phenol compound includes, for example, phenol, cresol, ethylphenol, butylphenol, nonylphenol, dinonylphenol, styrenated phenol, hydroxybenzoates and the like.

The active methylene compound includes, for example, dimethyl malonate, diethyl malonate, methyl acetoacetate, ethyl acetoacetate, acetylacetone and the like.

The mercaptan compound includes, for example, butylmercaptan, dodecylmercaptan and the like.

The acid amide compound includes, for example, acetanilide, acetic acid amide, ε-caprolactam, δ-valerolactam, γ-butyrolactam and the like.

The acid imide compound includes, for example, succinic acid imide, maleic acid imide and the like.

The imidazole compound includes, for example, imidazole, 2-methylimidazole and the like.

The urea compound includes, for example, urea, thiourea, ethyleneurea and the like.

The amine compound includes, for example, diphenylamine, aniline, carbazole and the like.

The imine compound includes, for example, ethyleneimine, polyethyleneimine and the like.

The bisulfite includes, for example, sodium bisulfite and the like.

The pyridine compound includes, for example, 2-hydroxypyridine, 2-hydroxyquinoline and the like.

The oxime compound includes, for example, formaldoxime, acetaldoxime, acetoxime, methyl ethyl ketoxime, cyclohexanone oxime and the like.

The pyrazole compound includes, for example, 3,5-dimethylpyrazole, 3,5-diethylpyrazole and the like.

The blocked isocyanato group and the blocked isothiacyanato group contained in the polymer compound of the present invention are each preferably a group represented by the following formula (3) or a group represented by the following formula (4).

[chemical formula 7]

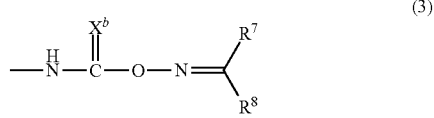

(3)

[chemical formula 8]

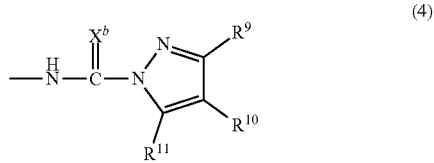

(4)

In the formulae (3) and (4), $X^b$ represents an oxygen atom or a sulfur atom.

$R^7$ to $R^{11}$ each independently represent a hydrogen atom or a monovalent organic group having a number of carbon atoms of 1 to 20. The definition and specific examples of the monovalent organic group having a number of carbon atoms of 1 to 20 represented by $R^7$ to $R^{11}$ are as described above.

In one embodiment of the present invention, it is preferable that $R^7$ and $R^8$ in the above-described formula (3) are each independently a group selected from the group consisting of a methyl group and an ethyl group. In other embodiments, it is preferable that $R^9$ and $R^{11}$ in the above-described formula (4) are each a methyl group and $R^{10}$ is a hydrogen atom.

The blocked isocyanato group includes, for example, O-(methylideneamino) carboxyamino group, O-(1-ethylideneamino)carboxyamino group, O-(1-methylethylideneamino)carboxyamino group, O-[1-methylpropylideneamino]carboxyamino group, (N-3,5-dimethylpyrazolylcarbonyl)amino group, (N-3-ethyl-5-methylpyrazolylcarbonyl)amino group, (N-3,5-diethylpyrazolylcarbonyl)amino group, (N-3-propyl-5-methylpyrazolylcarbonyl)amino group, (N-3-ethyl-5-propylpyrazolylcarbonyl)amino group and the like.

The blocked isothiocyanato group includes, for example, O-(methylideneamino)thiocarboxyamino group, O-(1-ethylideneamino)thiocarboxyamino group, O-(1-methylethylideneamino)thiocarboxyamino group, O-[1-methylpropylideneamino]thiocarboxyamino group, (N-3,5-dimethylpyrazolylthiocarbonyl)amino group, (N-3-ethyl-5-methylpyrazolylthiocarbonyl)amino group, (N-3,5-diethylpyrazolylthiocarbonyl)amino group, (N-3-propyl-5-methylpyrazolylthiocarbonyl)amino group, (N-3-ethyl-5-propylpyrazolylthiocarbonyl)amino group and the like.

The repeating unit having at least one group selected from the group consisting of a blocked isocyanato group and a blocked isothiocyanato group (first functional group) contained in the polymer compound of the present invention is preferably a repeating unit having a blocked isocyanato group.

In reacting a compound having at least one group selected from the group consisting of an isocyanato group and an isothiocyanato group and an unsaturated bond in the monomer with a blocking agent, if necessary, an organic solvent, a catalyst and the like can be added for the reaction.

When the total content of all repeating units contained in the above-described polymer compound is taken as 100% by mol, the content of the repeating unit having at least one group selected from the group consisting of a blocked isocyanato group and a blocked isothiocyanato group in the polymer compound is 1% by mol or more and 30% by mol or less, preferably 1% by mol or more and 20% by mol or less, more preferably 1% by mol or more and 15% by mol or less, from the standpoint of increasing the carrier mobility of an organic thin film transistor containing a film obtained by hardening the polymer compound. The content of the above-described repeating unit contained in the polymer compound is determined from the use amounts of raw material monomers corresponding to repeating units used in producing the polymer compound.

(Repeating Unit Having at Least One Group Selected from the Group Consisting of a Hydroxy Group and a Carboxy Group)

The polymer compound of the present invention contains a repeating unit having at least one group selected from the group consisting of a hydroxy group and a carboxy group.

In other words, the polymer compound of the present invention may contain only a repeating unit having a hydroxy group, may contain only a repeating unit having a carboxy group, or may contain only a repeating unit having a hydroxy group and a carboxy group. The polymer compound of the present invention may also contain two or more repeating units selected from the group consisting of a repeating unit having a hydroxy group, a repeating unit having a carboxy group and a repeating unit having a hydroxy group and a carboxy group.

The repeating unit having at least one group selected from the group consisting of a hydroxy group and a carboxy group contained in the polymer compound is preferably a repeating unit represented by the following formula (2), since the raw material thereof is easily available.

[chemical formula 9]

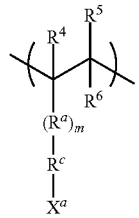

(2)

In the above-described formula (2), $R^4$, $R^5$ and $R^6$ each independently represent a hydrogen atom, a fluorine atom or a monovalent organic group having a number of carbon atoms of 1 to 20.

$R^a$ represents a divalent organic group having a number of carbon atoms of 1 to 20, a group represented by —O—, a group represented by —CO—, a group represented by —COO—, a group represented by —NHCO— or a group represented by —NHCOO—. A connecting bond of the above-described group represented by —O—, the above-described group represented by —CO—, the above-described group represented by —COO—, the above-described group represented by —NHCO— and the above-described group represented by —NHCOO— may be located on the carbon atom side to which the above-described $R^4$ is bonded in the above-described formula (2) or may be located on the $R^c$ side in the above-described formula (2).

$R^c$ represents a single bond or a divalent organic group having a number of carbon atoms of 1 to 20.

A hydrogen atom in the above-described divalent organic group may be substituted with a fluorine atom.

m represents an integer of 0 to 6.

$X^a$ represents a hydroxy group or a carboxy group.

When a plurality of $R^a$ are present, they are independent of each other.

In the above-described formula (2), $R^4$, $R^5$ and $R^6$ each independently represent preferably a hydrogen atom or a methyl group. m is preferably an integer of 0 to 2.

In the above-described formula (2), $R^a$ is preferably a group represented by —COO—, a group represented by —NHCO—, a group represented by —NHCOO—, a methylene group, an ethylene group, a n-propylene group, an isopropylene group, a n-butylene group or a phenylene group.

In the above-described formula (2), $R^c$ is preferably a single bond, a methylene group, an ethylene group, a n-propylene group, an isopropylene group, a n-butylene group or a phenylene group.

The preferable embodiment of the above-described formula (2) includes a case in which $R^4$, $R^5$ and $R^6$ are each a hydrogen atom or a methyl group, m is 1, $R^a$ is a group represented by —COO— and $R^c$ is a divalent aliphatic hydrocarbon group having a number of carbon atoms of 1 to 10 and a case in which $R^4$, $R^5$ and $R^6$ are each a hydrogen atom or a methyl group, m is 0 and $R^c$ is a divalent aromatic hydrocarbon group having a number of carbon atoms of 6 to 20.

The above-described repeating unit represented by the formula (2) includes, for example, repeating units represented by the following formula (2-1).

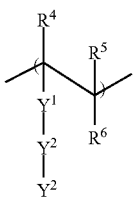

(2-1)

In the above-described formula (2-1), $R^4$, $R^5$, $R^6$ and $X^a$ represent the same meaning as described above. $Y^1$ represents a group represented by —COO—, a group represented by —NHCO—, a divalent organic group having a number of carbon atoms of 1 to 20 or a single bond. The connecting bond at the side of a carbon atom of the group represented by —COO— is located at the side of a carbon atom to which the above-described $R^4$ is bonded in the above-described formula (2-1), and the connecting bond at the side of a carbon atom of the group represented by —NHCO— is situated at the side of a carbon atom to which the above-described $R^4$ is bonded in the above-described formula (2-1). When $Y^1$ is a group represented by —COO— or a group represented by —NHCO—, $Y^2$ represents a divalent organic group having a number of carbon atoms of 1 to 20. When $Y^1$ is a group represented by a divalent organic group having a number of carbon atoms of 1 to 20, $Y^2$ represents a single bond. When $Y^1$ is a single bond, $Y^2$ represents a single bond.

Examples of the monomer used as the raw material of a repeating unit having at least one group selected from the group consisting of a hydroxy group and a carboxy group contained in the above-described polymer compound include 2-hydroxyethyl acrylate, 2-hydroxypropyl acrylate, 3-hydroxypropyl acrylate, 2-hydroxybutyl acrylate, 4-hydroxybutyl acrylate, 6-hydroxyhexyl acrylate, 8-hydroxyoctyl acrylate, 4-hydroxymethylcyclohexyl acrylate, 2-hydroxy-1-methylethyl acrylate, 2-(2-hydroxyethoxy)ethyl acrylate, 2-hydroxyphenylethyl acrylate, 3-hydroxy-1-adamantyl acrylate, 2-hydroxycyclohexyl acrylate, 3-hydroxycyclohexyl acrylate, 4-hydroxycyclohexyl acrylate, 2-hydroxy-3-phenoxypropyl acrylate, carboxymethyl acrylate, 2-carboxyethyl acrylate, 2-carboxypropyl acrylate, 3-carboxypropyl acrylate, 2-carboxybutyl acrylate, 4-carboxybutyl acrylate, 6-carboxyhexyl acrylate, 8-carboxyoctyl acrylate, 4-carboxymethylcyclohexyl acrylate, 2-carboxy-1-methylethyl acrylate, 2-carboxyphenylethyl acrylate, 3-carboxy-1-adamantyl acrylate, 2-carboxycyclohexyl acrylate, 3-carboxycyclohexyl acrylate, 2-carboxy-3-phenoxypropyl acrylate, 2-hydroxyethyl methacrylate, 2-hydroxypropyl methacrylate, 3-hydroxypropyl methacrylate, 2-hydroxybutyl methacrylate, 4-hydroxybutyl methacrylate, 6-hydroxyhexyl methacrylate, 8-hydroxyoctyl methacrylate, 4-hydroxymethylcyclohexyl methacrylate, 2-hydroxy-1-methylethyl methacrylate, 2-(2-hydroxyethoxy)ethyl methacrylate, 2-hydroxyphenylethyl methacrylate, 3-hydroxy-1-adamantyl methacrylate, 2-hydroxycyclohexyl methacrylate, 3-hydroxycyclohexyl methacrylate, 4-hydroxycyclohexyl methacrylate, 2-hydroxy-3-phenoxypropyl methacrylate, carboxymethyl methacrylate, 2-carboxyethyl methacrylate, 2-carboxypropyl methacrylate, 3-carboxypropyl methacrylate, 2-carboxybutyl methacrylate, 4-carboxybutyl methacrylate, 6-carboxyhexyl methacrylate, 8-carboxyoctyl methacrylate, 4-carboxymethylcyclohexyl methacrylate, 2-carboxy-1-methylethyl methacrylate, 2-carboxyphenylethyl methacrylate, 3-carboxy-1-adamantyl methacrylate, 2-carboxycyclohexyl methacrylate, 3-carboxycyclohexyl methacrylate, 2-carboxy-3-phenoxypropyl methacrylate, 2-propen-1-ol, hydroxyethyl vinyl ether, hydroxybutyl vinyl ether, 2-allylphenol, 3-allyloxypropionic acid, allyl 4-hydroxybenzoate, ethylene glycol monoallyl ether, 3-allyloxy-1,2-propanediol, o-hydroxystyrene, m-hydroxystyrene, p-hydroxystyrene, acrylic acid, methacrylic acid, fumaric acid, maleic acid, itaconic acid, 2-vinylbenzoic acid, 3-vinylbenzoic acid, 4-vinylbenzoic acid, 2-(trifluoromethyl)acrylic acid, 6-acrylamidehexanoic acid, N-(2-hydroxyethyl)acrylamide, N-(4-hydroxyphenyl)acrylamide, 2-acryloyloxyethyl-succinic acid, 2-acryloyloxyethylhexahydrophthalic acid, 2-acryloyloxyethylphthalic acid, 2-acryloyloxyethyl-2-hydroxyethylphthalic acid, 2,2-bis(allyloxymethyl)-1-butanol, 1,3-diallyloxy-2-propanol, 1,5-hexadiene-3,4-diol, pentaerythritol triacrylate, pentaerythritol trimethacrylate, 3-perfluorobutyl-2-hydroxypropyl acrylate, 3-perfluorohexyl-2-hydroxypropyl acrylate, 3-perfluorooctyl-2-hydroxypropyl acrylate, 3-(perfluoro-3-methylbutyl)-2-hydroxypropyl acrylate, 2-(perfluoro-3-methylbutyl)-2-hydroxypropyl acrylate, 3-(perfluoro-5-methylhexyl)-2-hydroxypropyl acrylate, 3-perfluorobutyl-2-hydroxypropyl methacrylate, 3-perfluorohexyl-2-hydroxypropyl methacrylate, 3-perfluorooctyl-2-hydroxypropyl methacrylate, 3-(perfluoro-3-methylbutyl)-2-hydroxypropyl methacrylate, 2-(perfluoro-3-methylbutyl)-2-hydroxypropyl methacrylate, 3-(perfluoro-5-methylhexyl)-2-hydroxypropyl methacrylate, 3-(perfluoro-7-methyloctyl)-2-hydroxypropyl methacrylate, 3-carboxy-2-hydroxypropyl acrylate and the like.

When the total content of all repeating units contained in the above-described polymer compound is taken as 100% by mol, the content of a repeating unit having an unsaturated double bond and at least one group selected from the group consisting of a hydroxy group and a carboxy group in the monomer of the polymer compound is preferably 1% by mol or more and 60% by mol or less, more preferably 1% by mol or more and 30% by mol or less, further preferably 1% by mol or more and 20% by mol or less, from the standpoint of increasing the carrier mobility of an organic film transistor containing a film obtained by hardening the polymer compound. The content of the above-described repeating unit contained in the polymer compound is determined from the use amounts of raw material monomers corresponding to repeating units used in producing the polymer compound.

(Repeating Unit Represented by the Formula (5))

The polymer compound may contain a repeating unit represented by the following formula (5).

[chemical formula 11]

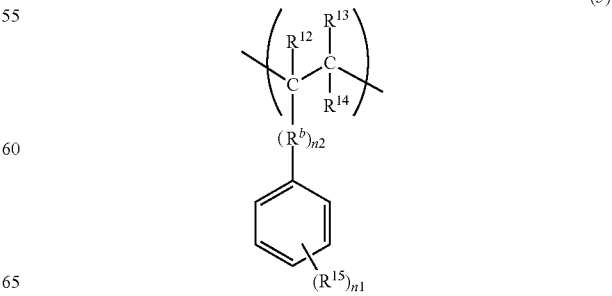

(5)

In the above-described formula (5), $R^{12}$, $R^{13}$ and $R^{14}$ each independently represent a hydrogen atom, a fluorine atom or a monovalent organic group having a number of carbon atoms of 1 to 20.

$R^{15}$ represents a chlorine atom, a fluorine atom, a bromine atom, an iodine atom or a monovalent organic group having a number of carbon atoms of 1 to 20.

$R^b$ represents a divalent organic group having a number of carbon atoms of 1 to 20, a group represented by —O—, a group represented by —CO—, a group represented by —COO—, a group represented by —NHCO— or a group represented by —NHCOO—. A connecting bond of the above-described group represented by —O—, the above-described group represented by —CO—, the above-described group represented by —COO—, the above-described group represented by —NHCO— and the above-described group represented by —NHCOO— may be located on the carbon atom side to which the above-described $R^{12}$ is bonded in the above-described formula (5) or may be located on the carbon atom side constituting a benzene ring in the above-described formula (5). A hydrogen atom in the above-described divalent organic group may be substituted with a fluorine atom.

n1 represents an integer of 0 to 5.

n2 represents an integer of 0 to 6.

When a plurality of $R^b$ are present, they are independent of each other. When a plurality of $R^{15}$ are present, they are independent of each other.

In the above-described formula (5), it is preferable that $R^{12}$, $R^{13}$ and $R^{14}$ each independently represent a hydrogen atom or a methyl group.

In the above-described formula (5), $R^b$ is preferably a divalent organic group having a number of carbon atoms of 1 to 20 or a group represented by —COO—. The divalent organic group having a number of carbon atoms of 1 to 20 is preferably a methylene group or an ethylene group.

In the above-described formula (5), n2 is preferably an integer of 0 to 2.

When the total content of all repeating units contained in the above-described polymer compound is taken as 100% by mol, the content of the above-described repeating unit represented by the formula (5) in the polymer compound is preferably 1% by mol or more and 70% by mol or less, more preferably 10% by mol or more and 60% by mol or less, further preferably 30% by mol or more and 50% by mol or less, from the standpoint of being able to enhance the dielectric breakdown strength of a film obtained by hardening the polymer compound.

Examples of the monomer used as the raw material of the above-described repeating unit represented by the formula (5) include styrene, 2,4-dimethyl-α-methylstyrene, o-methylstyrene, m-methylstyrene, p-methylstyrene, 2,4-dimethylstyrene, 2,5-dimethylstyrene, 2,6-dimethylstyrene, 3,4-dimethylstyrene, 3,5-dimethylstyrene, 2,4,6-trimethylstyrene, 2,4,5-trimethylstyrene, pentamethylstyrene, o-ethylstyrene, m-ethylstyrene, p-ethylstyrene, o-chlorostyrene, m-chlorostyrene, p-chlorostyrene, o-bromostyrene, m-bromostyrene, p-bromostyrene, o-methoxystyrene, m-methoxystyrene, p-methoxystyrene, 2-vinylbiphenyl, 3-vinylbiphenyl, 4-vinylbiphenyl, 4-vinyl-p-terphenyl, α-methylstyrene, o-isopropenyltoluene, m-isopropenyltoluene, p-isopropenyltoluene, 2,4-dimethyl-α-methylstyrene, 2,3-dimethyl-α-methylstyrene, 3,5-dimethyl-α-methylstyrene, p-isopropyl-α-methylstyrene, α-ethylstyrene, α-chlorostyrene, divinylbenzene, divinylbiphenyl, diisopropylbenzene, 4-(methoxymethoxy) styrene, 4-(methoxyethoxymethyloxy)styrene, 4-(1-ethoxyethyloxy)styrene, 2-(methoxymethoxycarbonyl) styrene, 2-(methoxyethoxymethyloxycarbonyl)styrene, 2-(1-ethoxyethyloxycarbonyl)styrene, 2-(tetrahydropyranyloxycarbonyl)styrene, 3-(methoxymethoxycarbonyl) styrene, 3-(methoxyethoxymethyloxycarbonyl)styrene, 3-(1-ethoxyethyloxycarbonyl)styrene, 3-(tetrahydropyranyloxycarbonyl)styrene, 4-(methoxymethoxycarbonyl) styrene, 4-(methoxyethoxymethyloxycarbonyl)styrene, 4-(1-ethoxyethyloxycarbonyl)styrene, 4-(tetrahydropyranyloxycarbonyl)styrene, benzyl methacrylate, 2-trifluoromethylstyrene, 3-trifluoromethylstyrene, 4-trifluoromethylstyrene, 2,3,4,5,6-pentafluorostyrene, 2-fluorostyrene, 3-fluorostyrene, 4-fluorostyrene, 2-fluoro-α-methylstyrene, 3-fluoro-α-methylstyrene, 4-fluoro-α-methylstyrene, 4-fluoro-β-methylstyrene, 4-trifluoromethyl-α-methylstyrene, 4-fluoro-2,6-dimethylstyrene, 2,3,4,5,6-pentafluorobenzyl acrylate, 2,3,4,5,6-pentafluorobenzyl methacrylate, 2-fluorobenzyl acrylate, 2-fluorobenzyl methacrylate, 3-fluorobenzyl acrylate, 3-fluorobenzyl methacrylate, 4-fluorobenzyl acrylate, 4-fluorobenzyl methacrylate, 4-trifluoromethylbenzyl acrylate, 4-trifluoromethylbenzyl methacrylate, 3-(4-fluorophenyl)-1-propene, 3-pentafluorophenyl-1-propene, 3-(4-trifluoromethylphenyl)-1-propene, (4-fluorophenyl) acrylate, (4-fluorophenyl) methacrylate, pentafluorophenyl acrylate, pentafluorophenyl methacrylate, 2-(pentafluorophenyl) ethyl acrylate, 2-(pentafluorophenyl) ethyl methacrylate, 2-(4-fluorophenyl)ethyl acrylate, 2-(4-fluorophenyl)ethyl methacrylate, N-(4-fluorophenyl)acrylamide, N-(4-fluorophenyl)methacrylamide, N-(pentafluorophenyl) acrylamide, N-(pentafluorophenyl)methacrylamide and the like.

(Other Repeating Unit)

The polymer compound of the present invention may also contain "other monomer unit" other than the repeating unit having at least one group selected from the group consisting of a blocked isocyanato group and a blocked isothiocyanato group, the repeating unit having at least one group selected from the group consisting of a hydroxy group and a carboxy group, the above-described repeating unit represented by the formula (1) and the above-described repeating unit represented by the formula (5).

The monomer used as the raw material of "other monomer unit" includes, for example, acrylates and derivatives thereof, methacrylates and derivatives thereof, acrylamides and derivatives thereof, methacrylamides and derivatives thereof, vinyl acetate and derivatives thereof, methacrylonitrile and derivatives thereof, acrylonitrile and derivatives thereof, organic carboxylic acid vinyl esters and derivatives thereof, organic carboxylic acid allyl esters and derivatives thereof, fumaric acid dialkyl esters and derivatives thereof, maleic acid dialkyl esters and derivatives thereof, itaconic acid dialkyl esters and derivatives thereof, organic carboxylic acid N-vinylamide derivatives, maleimide and derivatives thereof, terminal unsaturated hydrocarbons and derivatives thereof and the like, organic germanium derivatives and the like. The derivatives described as the monomer used as the raw material of "other monomer unit" do not contain a hydroxy group and a carboxy group.

As the acrylates and derivatives thereof as the monomer used as the raw material of "other monomer unit", monofunctional acrylates and polyfunctional acrylates can be used. The acrylates and derivatives thereof include, for example, methyl acrylate, ethyl acrylate, n-propyl acrylate, isopropyl acrylate, n-butyl acrylate, isobutyl acrylate, sec-butyl acrylate, hexyl acrylate, octyl acrylate, 2-ethylhexyl acrylate, decyl acrylate, isobornyl acrylate, cyclohexyl acrylate, phenyl acrylate, benzyl acrylate, 2-cyanoethyl acrylate, ethylene glycol diacrylate, propylene glycol diacrylate, 1,4- butanediol diacrylate, diethylene glycol diacrylate, triethylene glycol diacrylate, trimethylolpropane diacrylate, trimethylolpropane triacrylate, pentaerythritol pentaacrylate and the like.

As the methacrylates and derivatives thereof as the monomer used as the raw material of "other monomer unit", monofunctional methacrylates and polyfunctional methacrylates can be used. The methacrylates and derivatives thereof include, for example, methyl methacrylate, ethyl methacrylate, n-propyl methacrylate, isopropyl methacrylate, n-butyl methacrylate, isobutyl methacrylate, sec-butyl methacrylate, hexyl methacrylate, octyl methacrylate, 2-ethylhexyl methacrylate, decyl methacrylate, isobornyl methacrylate, cyclohexyl methacrylate, phenyl methacrylate, benzyl methacrylate, ethylene glycol dimethacrylate, propylene glycol dimethacrylate, 1,4-butanediol dimethacrylate, diethylene glycol dimethacrylate, triethylene glycol dimethacrylate, trimethylolpropane dimethacrylate, trimethylolpropane trimethacrylate, pentaerythritol pentamethacrylate and the like.

Examples of the acrylamide and derivatives thereof as the monomer used as the raw material of "other monomer unit" include acrylamide, N-methylacrylamide, N-ethylacrylamide, N-tert-butylacrylamide, N,N-dimethylacrylamide, N,N-diethylacrylamide, N-(butoxymethyl) acrylamide, N-[3-(dimethylamino)propyl]acrylamide, N-phenylacrylamide and N-acryloylmorpholine.

Examples of the methacrylamide and derivatives thereof as the monomer used as the raw material of "other monomer unit" include methacrylamide, N-methylmethacrylamide, N-ethylmethacrylamide, N-tert-butylmethacrylamide, N,N-dimethylmethacrylamide, N,N-diethylmethacrylamide, N-(butoxymethyl)methacrylamide, N-[3-(dimethylamino)propyl]methacrylamide, N-phenylmethacrylamide and N-acryloylmorpholine.

Examples of the acrylonitrile and derivatives thereof as the monomer used as the raw material of "other monomer unit" include acrylonitrile and the like. Examples of the methacrylonitrile and derivatives thereof include methacrylonitrile and the like.

Examples of the organic carboxylic acid vinyl ester and derivatives thereof as the monomer used as the raw material of "other monomer unit" include vinyl acetate, vinyl propionate, vinyl butyrate, vinyl benzoate, divinyl adipate and the like.

Examples of the organic carboxylic acid allyl ester and derivatives thereof as the monomer used as the raw material of "other monomer unit" include allyl acetate, allyl benzoate, diallyl adipate, diallyl terephthalate, diallyl isophthalate, diallyl phthalate and the like.

Examples of the fumaric acid dialkyl ester and derivatives thereof as the monomer used as the raw material of "other monomer unit" include dimethyl fumarate, diethyl fumarate, diisopropyl fumarate, di-sec-butyl fumarate, diisobutyl fumarate, di-n-butyl fumarate, di-2-ethylhexyl fumarate, dibenzyl fumarate and the like.

Examples of the maleic acid dialkyl ester and derivatives thereof as the monomer used as the raw material of "other monomer unit" include dimethyl maleate, diethyl maleate, diisopropyl maleate, di-sec-butyl maleate, diisobutyl maleate, di-n-butyl maleate, di-2-ethylhexyl maleate, dibenzyl maleate and the like.

Examples of the itaconic acid dialkyl ester and derivatives thereof as the monomer used as the raw material of "other monomer unit" include dimethyl itaconate, diethyl itaconate, diisopropyl itaconate, di-sec-butyl itaconate, diisobutyl itaconate, di-n-butyl itaconate, di-2-ethylhexyl itaconate, dibenzyl itaconate and the like.

Examples of the organic carboxylic acid N-vinylamide derivative as the monomer used as the raw material of "other monomer unit" include N-methyl N-vinylacetamide and the like.

Examples of the maleimide and derivatives thereof as the monomer used as the raw material of "other monomer unit" include N-phenylmaleimide, N-cyclohexylmaleimide and the like.

Examples of the terminal unsaturated hydrocarbon and derivatives thereof as the monomer used as the raw material of "other monomer unit" include 1-butene, 1-pentene, 1-hexene, 1-octene, vinylcyclohexane, vinyl chloride and the like.

Examples of the organic germanium derivative as the monomer used as the raw material of "other monomer unit" include allyltrimethylgermanium, allyltriethylgermanium, allyltributylgermanium, trimethylvinylgermanium, triethylvinylgermanium and the like.

The monomer used as the raw material of these "other monomer units" is selected appropriately depending on the properties required for the insulation layer. As the monomer used as the raw material of "other monomer unit", methacrylates and derivatives thereof, acrylates and derivatives thereof, acrylonitrile and derivatives thereof, methacrylonitrile and derivatives thereof and organic germanium derivatives are preferable, acrylic acid alkyl esters, methacrylic acid alkyl esters, acrylonitrile, methacrylonitrile and allyltrimethylgermanium are more preferable.

Specific examples of the polymer compound of the present invention are shown below, but the present invention is not limited to them. In the following specific examples, x, y, z, w and v represent % by mol of respective constitutional units. z is 1 to 30 and x+y+z+w+v=100.

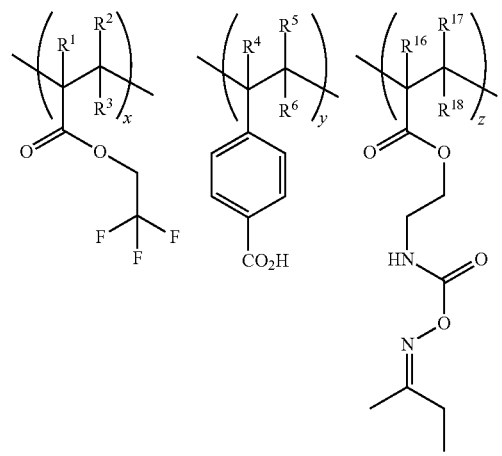

19
-continued
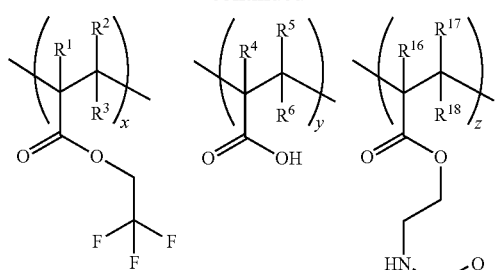
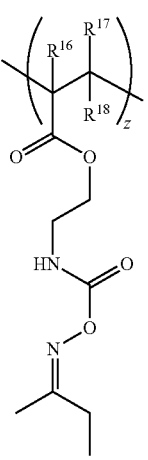
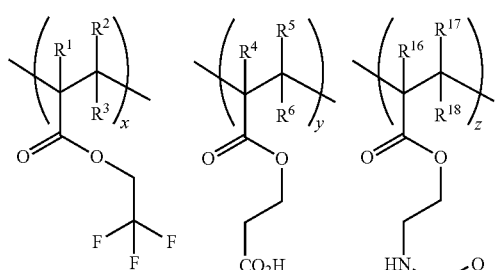
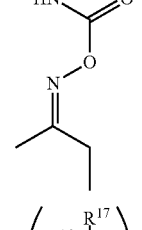
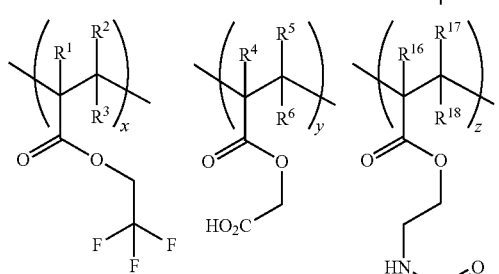
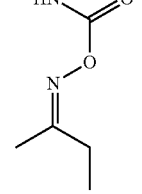
20
-continued
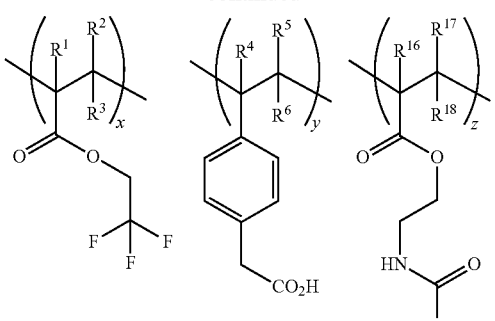
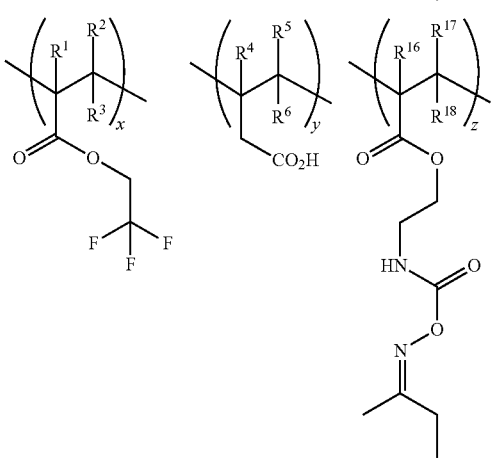
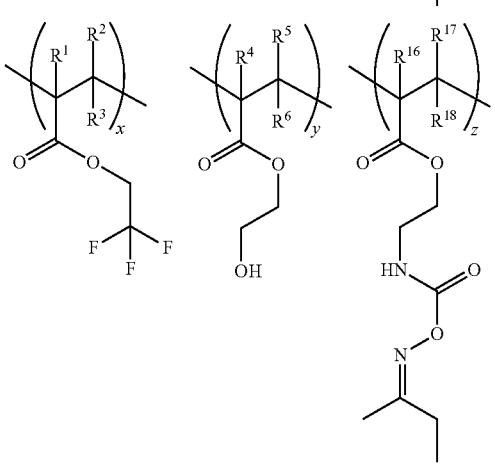

21
-continued
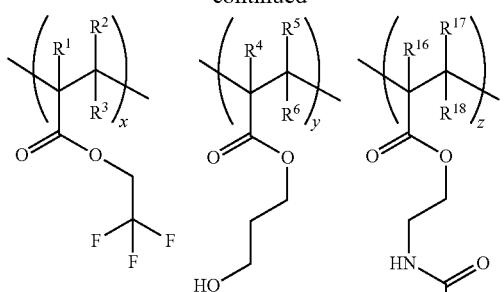
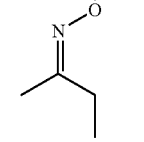
22
-continued
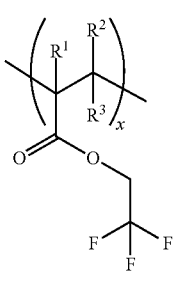
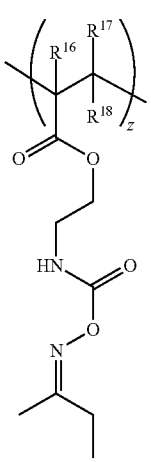
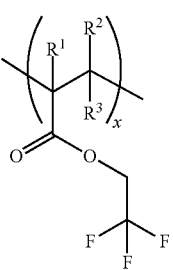
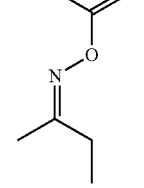
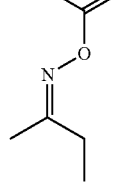
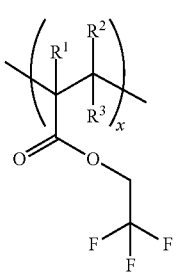
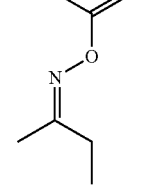
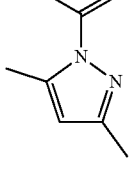

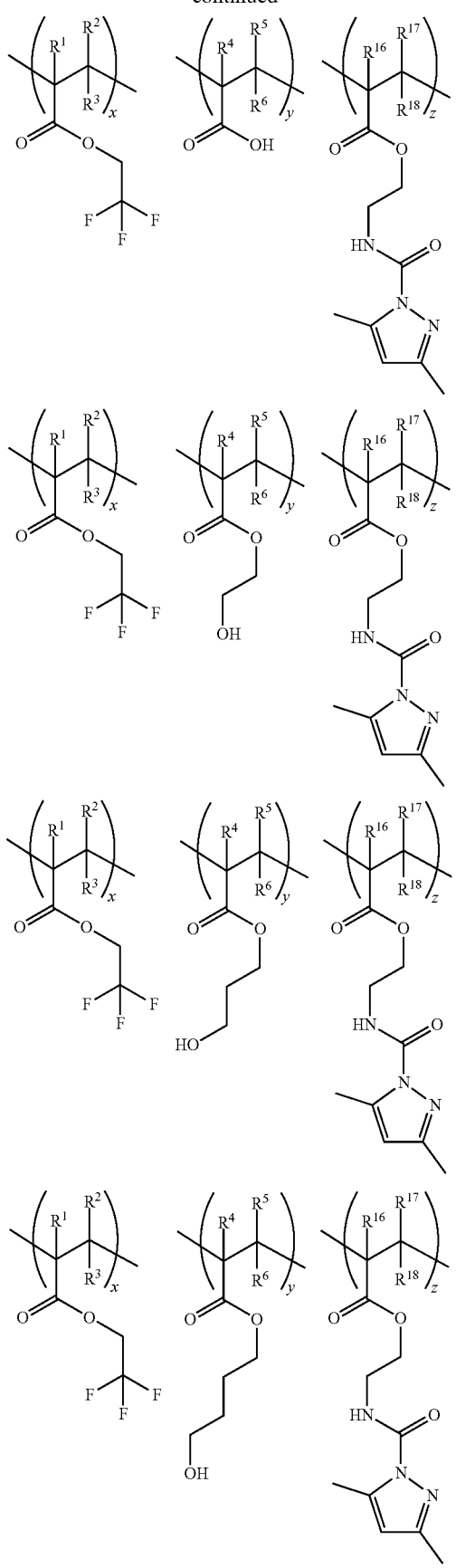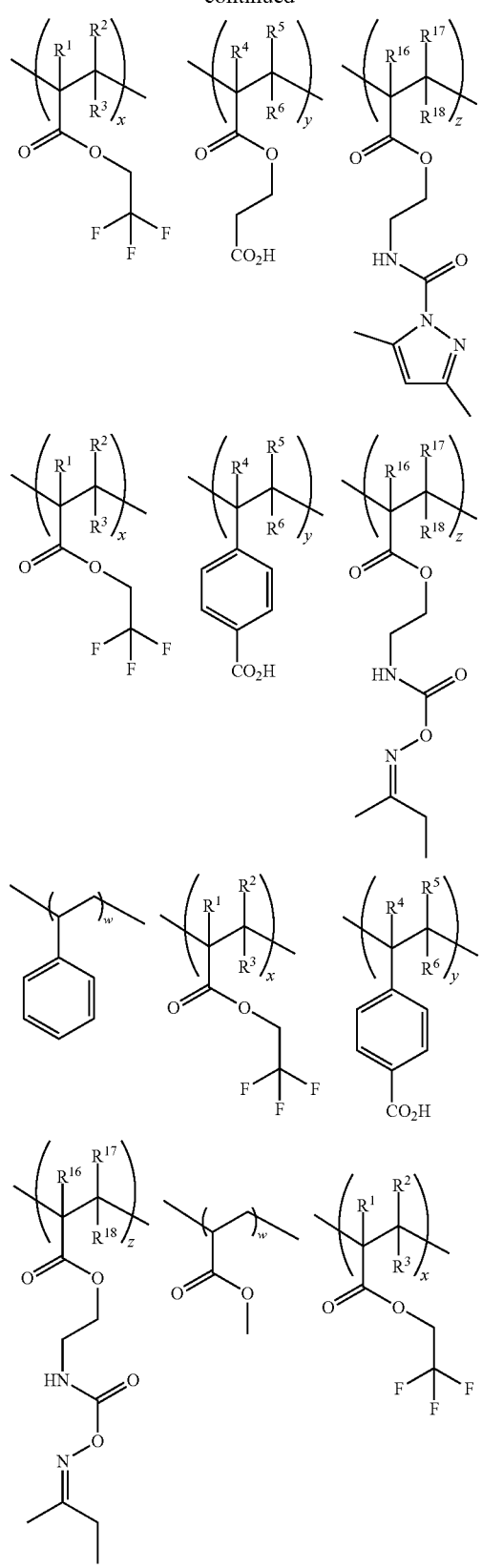

-continued
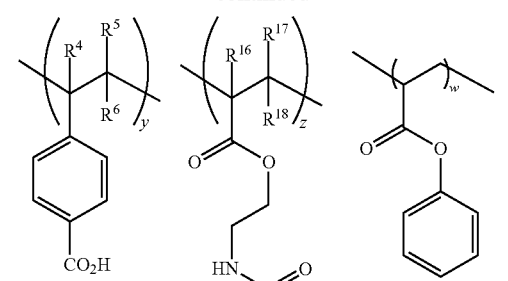
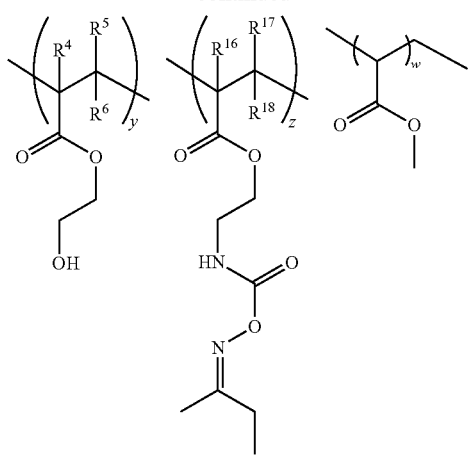
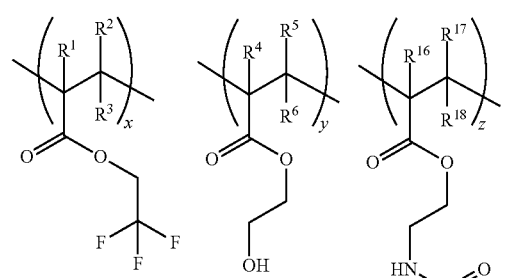
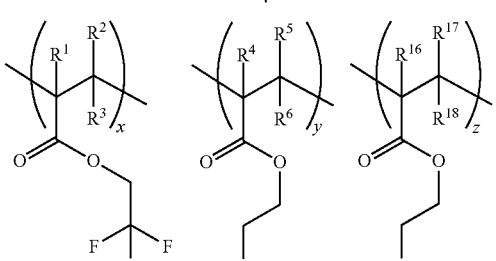
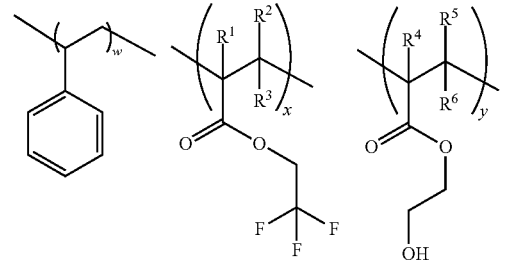
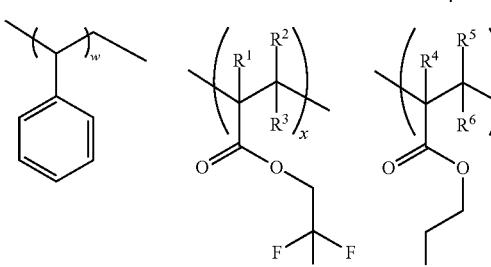
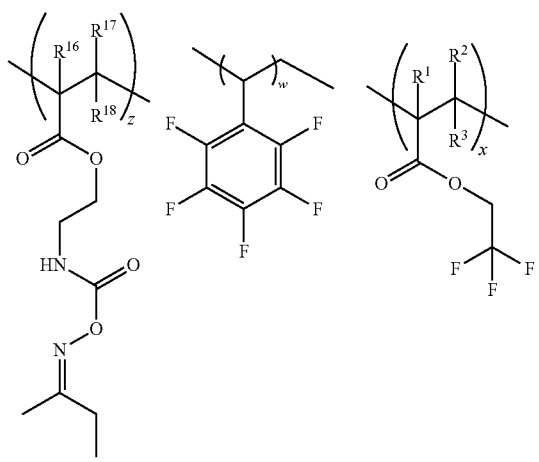
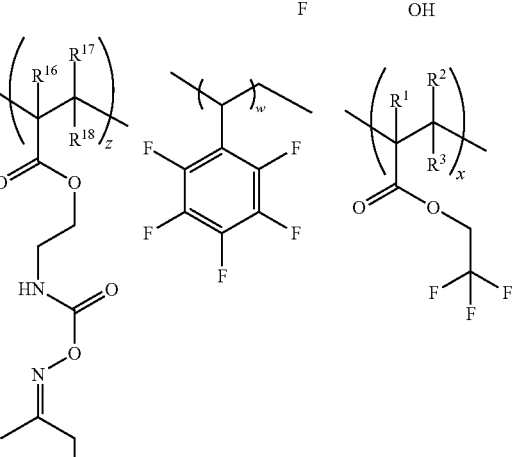

-continued
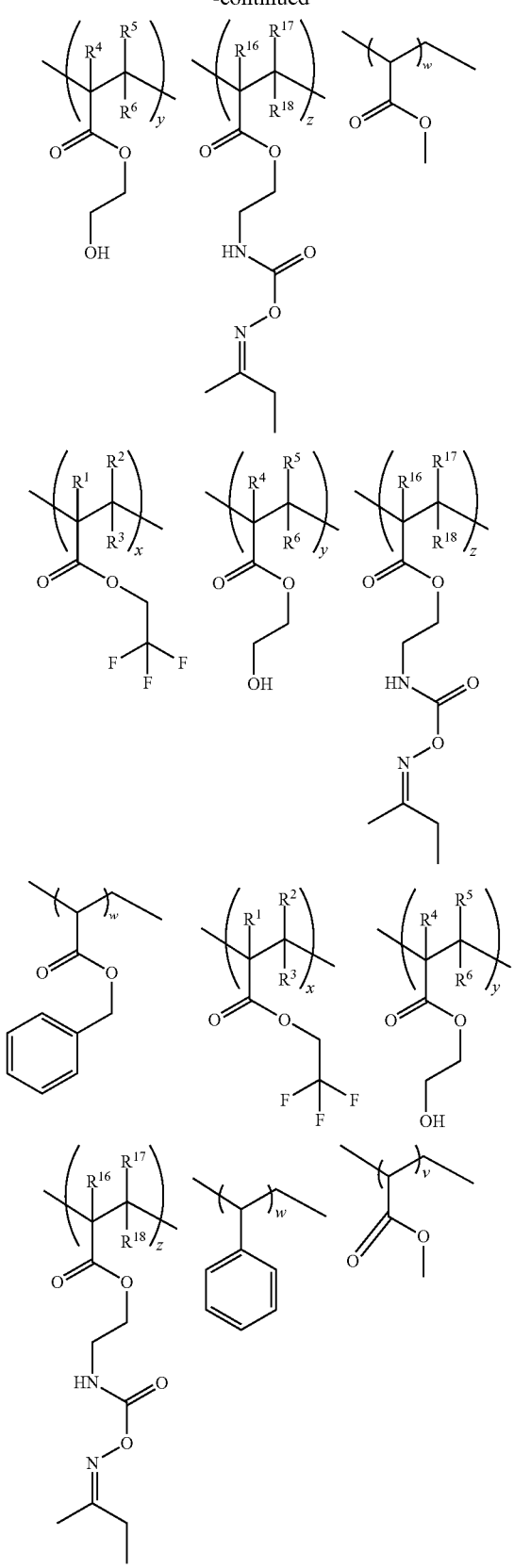
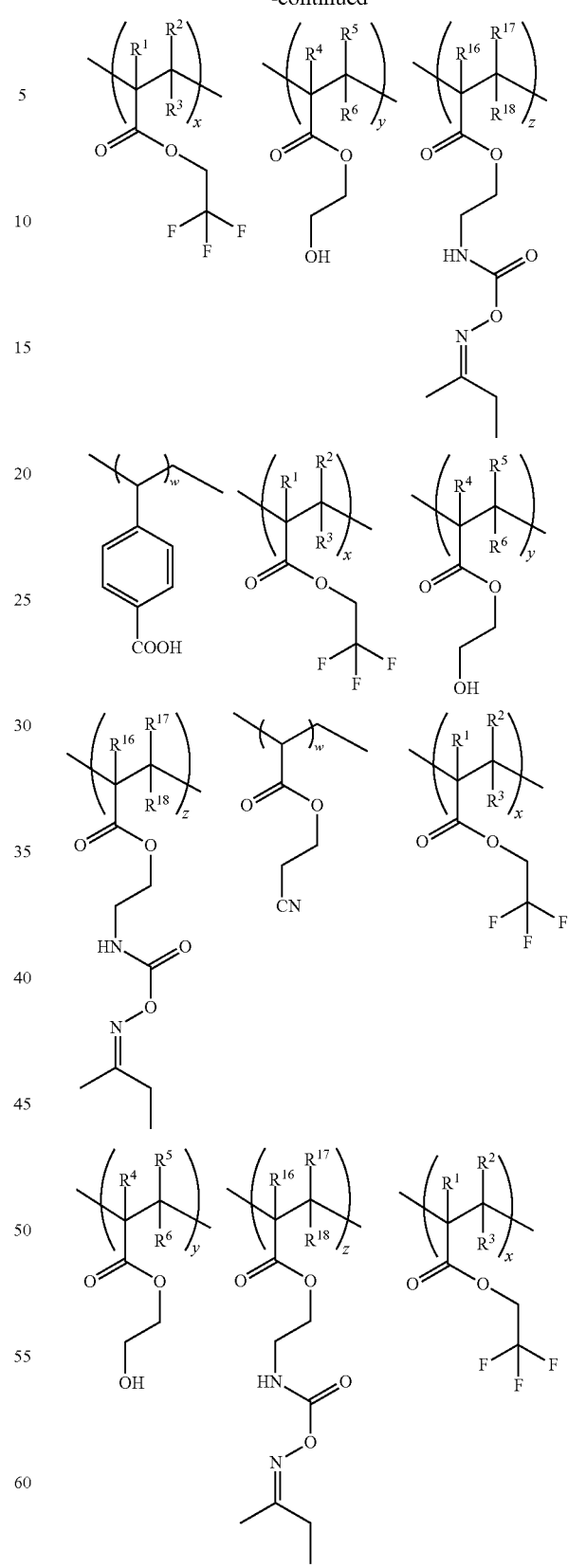

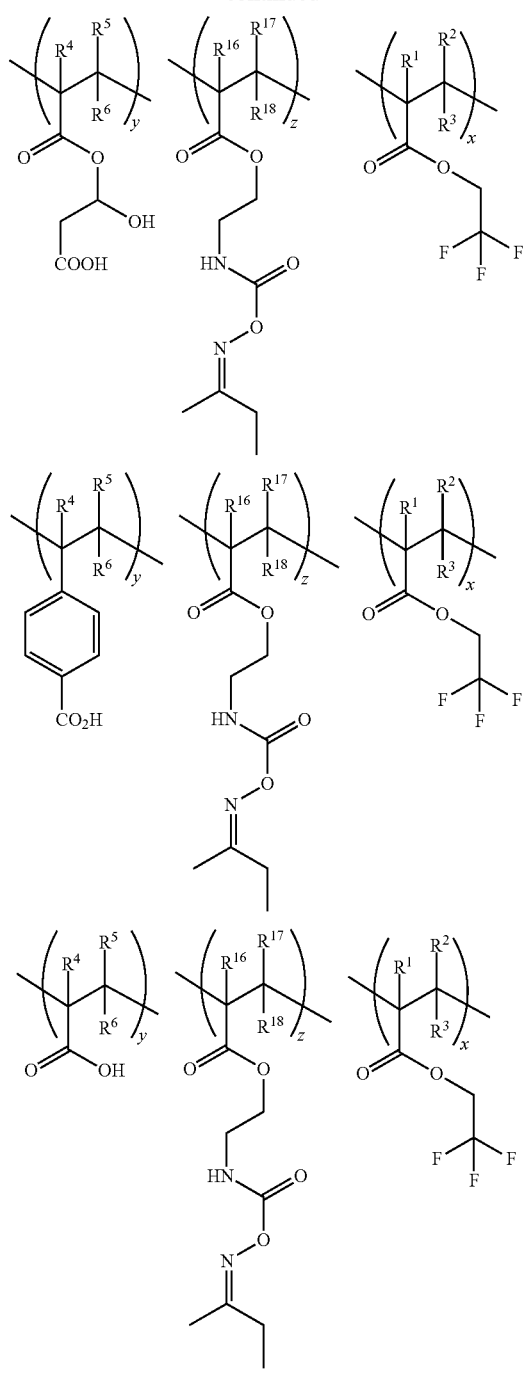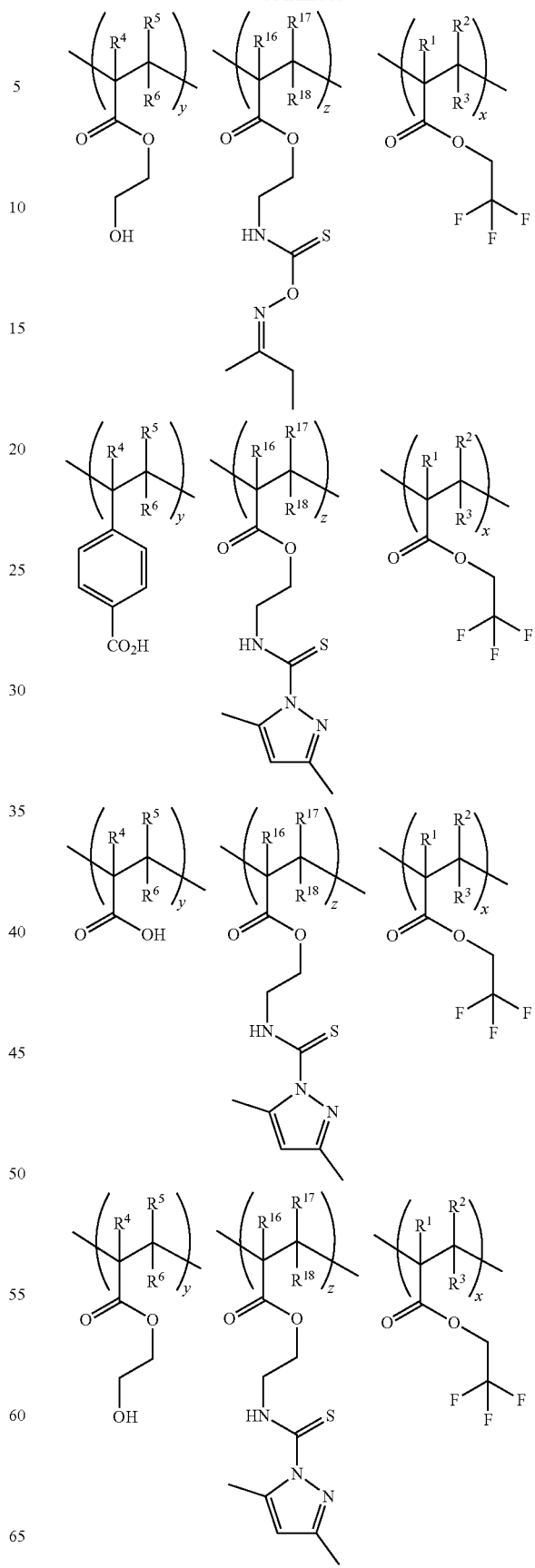

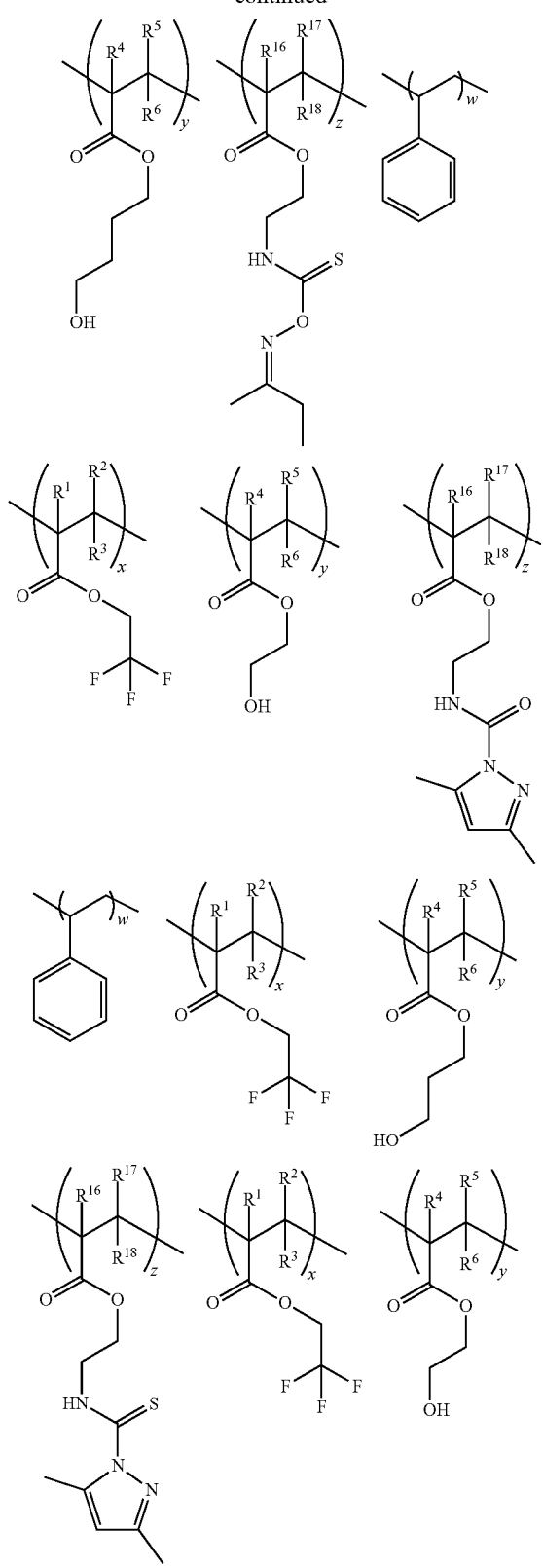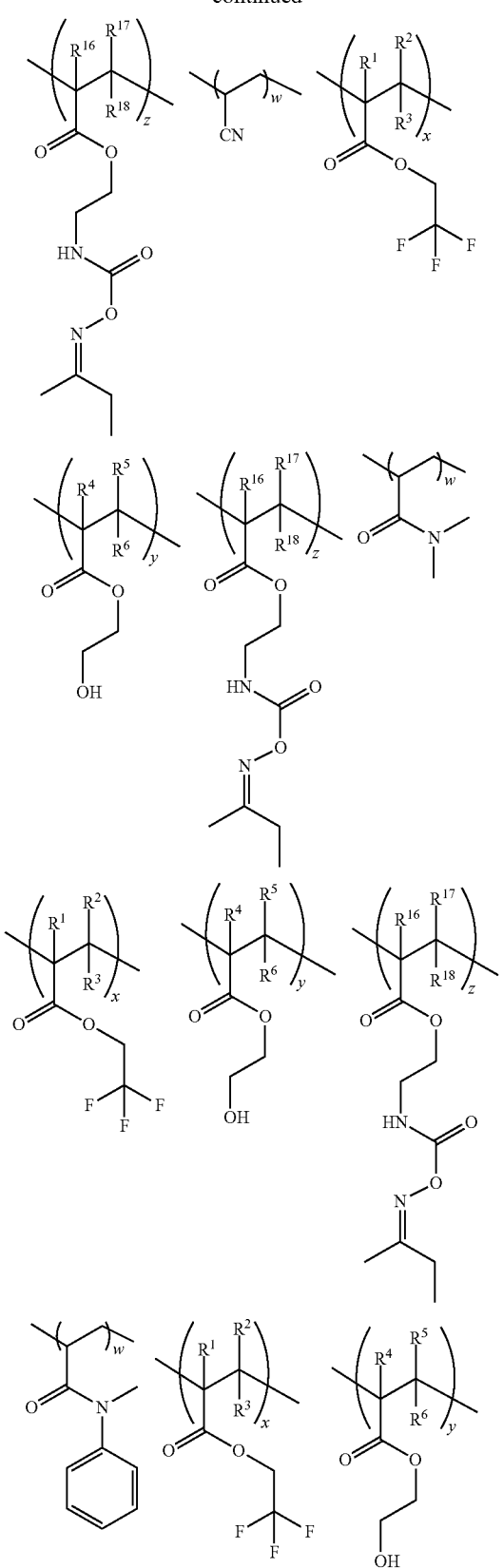

33
-continued
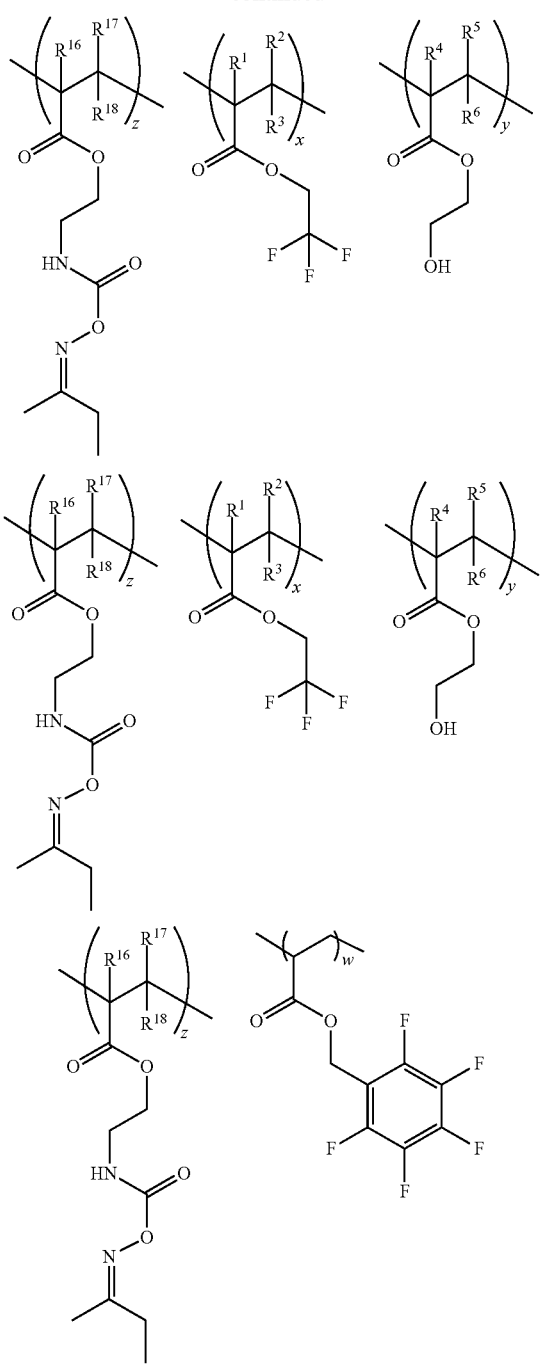
34
-continued
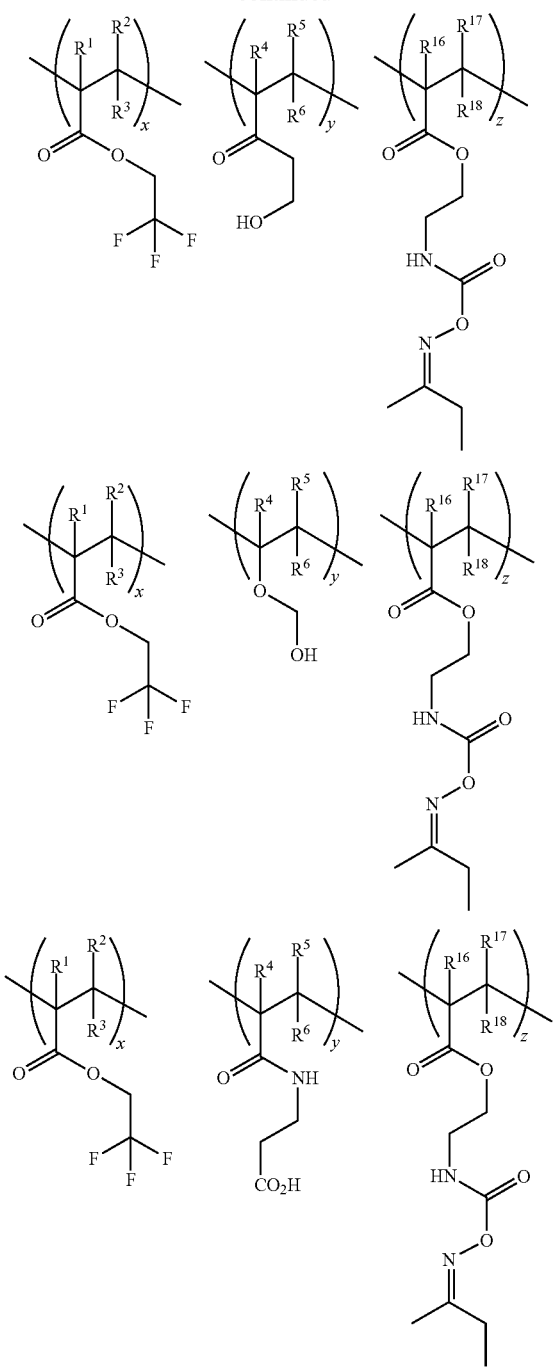

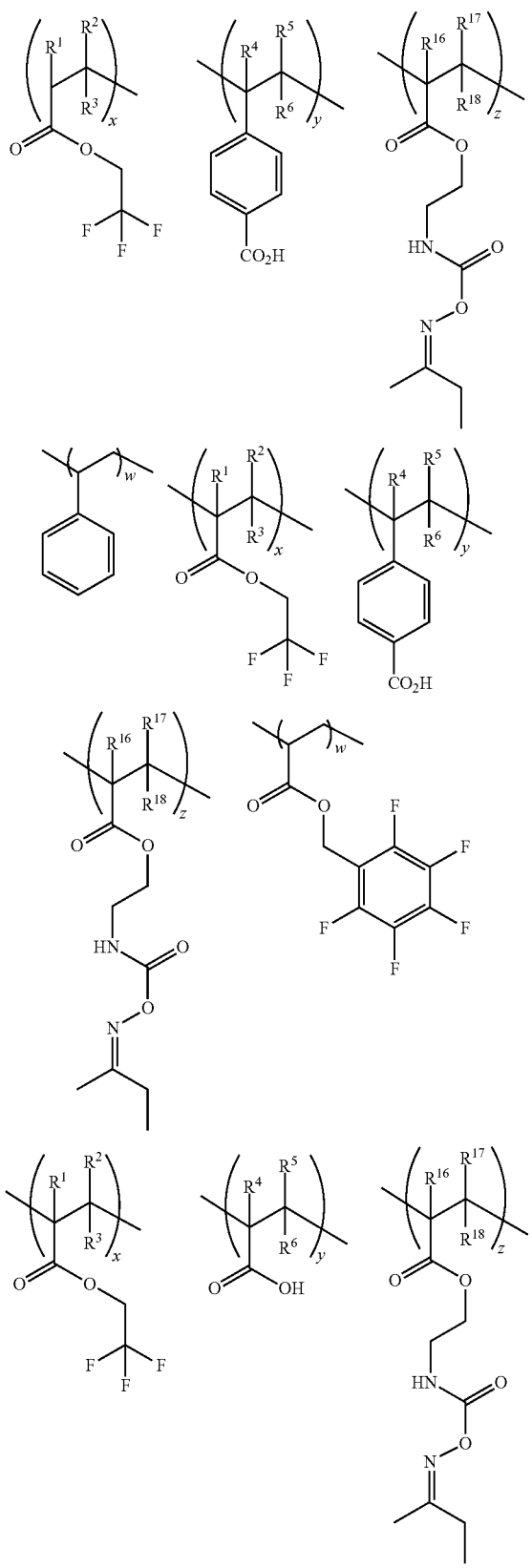

$R^1$, $R^2$ and $R^3$ each independently represent a hydrogen atom or a methyl group. $R^4$, $R^5$, $R^6$, $R^{16}$, $R^{17}$ and $R^{18}$ each independently represent a hydrogen atom, a fluorine atom or a monovalent organic group having a number of carbon atoms of 1 to 20.

(Production Method of Polymer Compound)

The polymer compound of the present invention can be produced, for example, by a method of copolymerizing a polymerizable monomer as the raw material of a repeating unit having at least one group selected from the group consisting of a blocked isocyanato group and a blocked isothiocyanato group, a polymerizable monomer as the raw material of a repeating unit having at least one group selected from the group consisting of a hydroxy group and a carboxy group and a polymerizable monomer as the raw material of the above-described repeating unit represented by the formula (1), using a photopolymerization initiator or a thermal polymerization initiator.

The photopolymerization initiator used for production of a polymer compound includes, for example, carbonyl compounds such as acetophenone, 2,2-dimethoxy-2-phenylacetophenone, 2,2-diethoxyacetophenone, 4-isopropyl-2-hydroxy-2-methylpropiophenone, 2-hydroxy-2-methylpropiophenone, 4,4'-bis(diethylamino) benzophenone, benzophenone, methyl(o-benzoyl) benzoate, 1-phenyl-1,2-propanedione-2-(o-ethoxycarbonyl)oxime, 1-phenyl-1,2-propanedione-2-(o-benzoyl)oxime, benzoin, benzoin methyl ether, benzoin ethyl ether, benzoin isopropyl ether, benzoin isobutyl ether, benzoin octyl ether, benzyl, benzyl dimethyl ketal, benzyl diethyl ketal, diacetyl and the like, anthraquinone or thioxanthone derivatives such as methylanthraquinone, chloroanthraquinone, chlorothioxanthone, 2-methylthioxanthone, 2-isopropylthioxanthone and the like, and sulfur compounds such as diphenyl disulfide, dithiocarbamate and the like.

The thermal polymerization initiator used for production of a polymer compound may be any one as long as it serves as an initiator for radical polymerization, and includes, for example, azo compounds such as 2,2'-azobisisobutyronitrile, 2,2'-azobisisovaleronitrile, 2,2'-azobis(2,4-dimethylvaleronitrile), 4,4'-azobis(4-cyano valeric acid), 1,1'-azobis(cyclohexanecarbonitrile), 2,2'-azobis(2-methylpropane), 2,2'-azobis(2-methylpropionamidine)dihydrochloride and the like, ketone peroxides such as methyl ethyl ketone peroxide, methyl isobutyl ketone peroxide, cyclohexanone peroxide, acetylacetone peroxide and the like, diacyl peroxides such as isobutyl peroxide, benzoyl peroxide, 2,4-dichlorobenzoyl peroxide, o-methylbenzoyl peroxide, lauroyl peroxide, p-chlorobenzoyl peroxide and the like, hydroperoxides such as 2,4,4-trimethylpentyl-2-hydroperoxide, diisopropylbenzene peroxide, cumene hydroperoxide, tert-butyl peroxide and the like, dialkyl peroxides such as dicumyl peroxide, tert-butylcumyl peroxide, di-tert-butyl peroxide, tris(tert-butylperoxy)triazine and the like, peroxy ketals such as 1,1-di-tert-butylperoxycyclohexane, 2,2-di(tert-butylperoxy)butane and the like, alkyl peresters such as tert-butylperoxy pivalate, tert-butylperoxy-2-ethylhexanoate, tert-butylperoxyisobutyrate, di-tert-butylperoxyhexahydro terephthalate, di-tert-butylperoxy azelate, tert-butylperoxy-3,5,5-trimethylhexanoate, tert-butylperoxy acetate, tert-butylperoxy benzoate, di-tert-butylperoxytrimethyl adipate and the like, and percarbonates such as diisopropylperoxy dicarbonate, di-sec-butylperoxy dicarbonate, tert-butylperoxyisopropyl carbonate and the like.

<Composition Comprising Polymer Compound and Organic Solvent>

The composition of the present invention is a composition comprising the above-described polymer compound and an organic solvent.

The composition of the present invention may also contain additives and the like usually used in cross-linking a polymer compound.

The composition of the present invention may contain two or more kinds of the above-described polymer compounds. The composition of the present invention may also contain a polymer compound different from the polymer compound of the present invention.

The organic solvent includes ether solvents such as tetrahydrofuran, diethyl ether and the like, aliphatic hydrocarbon solvents such as hexane and the like, alicyclic hydrocarbon solvents such as cyclohexane and the like, unsaturated hydrocarbon solvents such as pentene and the like, aromatic hydrocarbon solvents such as xylene and the like, ketone solvents such as cyclopentanone, 2-heptanone, acetone and the like, acetate solvents such as propylene glycol monomethyl ether acetate, butyl acetate and the like, halide solvents such as chloroform and the like, and mixed solvents thereof. Organic solvents having a boiling point of 100° C. to 200° C. at normal pressure are preferable, and specific examples thereof include 2-heptanone, propylene glycol monomethyl ether acetate, cyclopentanone and the like. The additives include catalysts for promoting the crosslinking reaction, leveling agents, viscosity regulators, surfactants and the like.

When the composition of the present invention is used for fabrication of a film obtained by hardening described later, the content of an organic solvent contained in the composition is preferably 30% by weight to 95% by weight, when the total weight of the composition is taken as 100% by weight.

<Film Obtained by Hardening Polymer Compound>

The polymer compound of the present invention can be hardened to give a film. The film of the present invention can be formed by a production method containing a step of applying the composition of the present invention described already, for example, on the surface of a base material as a forming target to form an applied layer and a step of hardening the applied layer.

The method of applying the above-described composition on the surface of a base material includes a spin coat method, a die coat method, a screen printing method, an inkjet method and the like conventionally known.

For the film of the present invention, a step of drying the applied layer may be provided between the step of applying the above-described composition on the surface of a base material to form an applied layer and the step of hardening the applied layer.

The above-described drying step is intended to remove a solvent in the applied layer formed on the base material. The hardening step is conducted for the purpose of advancing the cross-linking reaction by a reactive functional group possessed by the polymer compound in the applied layer to form a film as a hardened material obtained by hardening the polymer compound. Hardening of the applied layer can be performed by irradiation of the applied layer with electromagnetic wave or by heating of the applied layer.

Electronic Device

An electronic device containing a film obtained by hardening the above-described polymer compound will be described. The film of the present invention already described can be used for various electronic devices such as an organic thin film transistor, an organic LED, a sensor and the like.

The electronic device is preferably an organic thin film transistor. It is preferable that the film of the present invention is contained as a gate insulation layer of an organic thin film transistor.

The film of the present invention can also be used as a protective layer such as an over coat layer, an under coat layer and the like of an organic thin film transistor.

The organic thin film transistor may have, for example, further a film obtained by hardening the polymer compound of the present invention as an over coat layer, in addition to a gate insulation layer as a film obtained by hardening the polymer compound of the present invention.

The organic thin film transistor to which a film obtained by hardening the polymer compound of the present invention can be suitably applied will be described below.

<Organic Thin Film Transistor>

The organic thin film transistor of the present invention contains a gate insulation layer obtained by hardening the polymer compound of the present invention already explained.

An embodiment of an organic thin film transistor to which the polymer compound of the present invention is suitably applied will be described with reference to drawings below.

FIG. 1 is a schematic view schematically showing the structure of a bottom gate top contact type organic thin film transistor according to the first embodiment of the present invention.

As shown in FIG. 1, the organic thin film transistor 10 of the first embodiment has a substrate 1, a gate electrode 2 provided so as to be bonded to the main surface of the substrate 1, a gate insulation layer 3 provided on the substrate 1 so as to cover the gate electrode 2, an organic semiconductor layer 4 bonded to the gate insulation layer 3 and provided so as to cover directly above the gate electrode 2, a source electrode 5 and a drain electrode 6 which are provided so as to be bonded to the organic semiconductor layer 4, sandwiching a channel region and provided so as to be separated from each other so that the channel region overlaps the gate electrode 2 when viewed in the thickness direction of the substrate 1 (in a planar view), and an over coat layer 7 provided so as to cover the gate electrode 2, the gate insulation layer 3, the organic semiconductor layer 4, the source electrode 5 and the drain electrode 6 provided on the substrate 1.

FIG. 2 is a schematic view schematically showing the structure of a bottom gate bottom contact type organic thin film transistor 10 according to the second embodiment of the present invention.

As shown in FIG. 2, the organic thin film transistor 10 of the second embodiment has a substrate 1, a gate electrode 2 provided so as to be bonded to the main surface of the substrate 1, a gate insulation layer 3 provided on the substrate 1 so as to cover the gate electrode 2, a source electrode 5 and a drain electrode 6 which are bonded to the gate insulation layer 3, sandwiching a channel region and provided so as to be separated from each other so that the channel region overlaps the gate electrode 2 when viewed in the thickness direction of the substrate 1 (in a planar view), an organic semiconductor layer 4 provided so as to cover parts of the source electrode 5 and the drain electrode 6 and a part of the gate insulation layer 3 containing the channel region, spanning the source electrode 5 and the drain electrode 6, and an over coat layer 7 provided so as to cover the gate electrode 2, the gate insulation layer 3, the organic semiconductor layer 4, the source electrode 5 and the drain electrode 6 provided on the substrate 1.

<Production Method of Organic Thin Film Transistor>

The above-described bottom gate top contact type organic thin film transistor 10 of the first embodiment can be produced, for example, by forming a gate electrode 2 on the main surface of a substrate 1, forming a gate insulation layer 3 so as to cover the gate electrode 2 on the surface of the substrate 1 (base material) on which the gate electrode 2 has been provided, forming an organic semiconductor layer 4 on the gate insulation layer 3, forming a source electrode 5 and a drain electrode 6 so as to be bonded to the organic semiconductor layer 4, and further if necessary, forming an over coat layer 7 so as to cover the gate electrode 2, the gate insulation layer 3, the organic semiconductor layer 4, the source electrode 5 and the drain electrode 6 provided on the substrate 1.

The above-described bottom gate bottom contact type organic thin film transistor of the second embodiment can be produced, for example, by forming a gate electrode 2 on the main surface of a substrate 1, forming a gate insulation layer 3 so as to cover the gate electrode 2 on the surface of the substrate 1 (base material) on which the gate electrode 2 had been provided, forming a source electrode 5 and a drain electrode 6 on the gate insulation layer 3, forming an organic semiconductor layer 4 so as to cover parts of the source electrode 5 and the drain electrode 6 and a part of the gate insulation layer 3 containing the channel region, spanning the source electrode 5 and the drain electrode 6, and further if necessary, forming an over coat layer 7 so as to cover the gate electrode 2, the gate insulation layer 3, the organic semiconductor layer 4, the source electrode 5 and the drain electrode 6 provided on the substrate 1.

The production method of the gate insulation layer 3 of the organic thin film transistor 10 contains a step of applying a composition containing the polymer compound of the present invention and an organic solvent on the surface of a base material to form an applied layer and a step of hardening the applied layer.

In the above-described production method of the gate insulation layer 3, a step of drying the applied layer may be provided between the above-described step of applying the composition on the surface of a base material to form an applied layer and the above-described step of hardening the applied layer. The step of drying the applied layer in the formation step of the gate insulation layer 3 is intended to remove a solvent in the applied layer formed on the base material. The hardening step is intended to advance a crosslinking reaction by a reactive functional group possessed by a polymer compound in the applied layer to form the gate insulation layer 3 in which the polymer compound is hardened.

The contact angle of the gate insulation layer 3 with respect to pure water can be appropriately adjusted by increasing or decreasing the hydrophilicity of the surface of the gate insulation layer 3 in view of the amounts of a fluorine atom, a hydrophobic functional group and a hydrophilic functional group which the above-described polymer compound has.

The increase or decrease in hydrophilicity of the surface of the gate insulation layer 3 can be performed by adjusting components of an atmosphere in which the heat treatment is performed. For example, when a drying step and a hardening step (heating or sintering) conducted in forming the gate insulation layer 3 are performed in an atmosphere containing oxygen, the hydrophilicity of the surface of the gate insulation layer 3 increases, while when performed in an inert gas atmosphere, the hydrophilicity of the surface of the gate insulation layer 3 lowers. In the case of heating in an atmosphere containing oxygen, when temperature is increased, the hydrophilicity of the surface of the gate insulation layer 3 increases more.

Particularly, by controlling the amount of a fluorine atom, the surface energy of the gate insulation layer 3 can be adjusted in a suitable range, and as a result, the interface with the organic semiconductor layer 4 can be a favorable interface. By this, the carrier mobility of an organic film transistor can be further improved.

A self-assembled monomolecular layer may be formed on the surface at the side of the organic semiconductor layer 4 of the gate insulation layer 3. This self-assembled monomolecular layer can be formed, for example, by treating the gate insulation layer 3 with a solution prepared by dissolving an alkylchlorosilane compound or an alkylalkoxysilane compound at a concentration of 1 to 10% by mass in an organic solvent.

The alkylchlorosilane compound for forming the self-assembled monomolecular layer includes, for example, methyltrichlorosilane, ethyltrichlorosilane, butyltrichlorosilane, decyltrichlorosilane, octadecyltrichlorosilane and the like.

The alkylalkoxysilane compound for forming the self-assembled monomolecular layer includes methyltrimethoxysilane, ethyltrimethoxysilane, butyltrimethoxysilane, decyltrimethoxysilane, octadecyltrimethoxysilane and the like.

The substrate 1, the gate electrode 2, the source electrode 5, the drain electrode 6 and the organic semiconductor layer 4 may be constituted with materials and methods usually used for production methods of organic thin film transistors known conventionally. As the substrate 1, for example, a resin substrate or a resin film, a plastic substrate or a plastic film, a glass substrate, a silicon substrate and the like are used. Examples of the material of the gate electrode 2, the source electrode 5 and the drain electrode 6 include chromium, gold, silver, aluminum and the like. The gate electrode 2, the source electrode 5 and the drain electrode 6 can be formed by known methods such as a vapor deposition method, a sputtering method, application methods such as an inkjet printing method, and the like.

As the organic semiconductor compound as the material of an organic semiconductor layer 4, n conjugated polymers are widely used and, for example, polypyrroles, polythiophenes, polyanilines, polyallylamines, fluorenes, polycarbazoles, polyindoles, poly(p-phenylenevinylene)s and the like can be used.

As the organic semiconductor compound as the material of an organic semiconductor layer 4, low molecular weight compounds having solubility in an organic solvent can also be used. Such low molecular weight compounds include, for example, polycyclic aromatic derivatives such as pentacene and the like; phthalocyanine derivatives, perylene derivatives, tetrathiafulvalene derivatives, tetracyanoquinodimethane derivatives, fullerenes, carbon nanotubes and the like. Examples of such low molecular weight compounds include, specifically, a condensate of 9,9-di-n-octylfluorene-2,7-di(ethylene boronate) with 5,5'-dibromo-2,2'-bithiophene, and the like.

In the formation step of an organic semiconductor layer 4, for example, a solvent or the like is optionally added to the organic semiconductor compound to prepare an application solution for forming the organic semiconductor layer 4, this is applied on a gate insulation layer 3, a source electrode 5 and a drain electrode 6, and the applied layer is dried.

The solvent which can be used for the formation step of the organic semiconductor layer 4 is not particularly restricted providing it is a solvent capable of dissolving or dispersing an organic semiconductor compound. As such a solvent, solvents having a boiling point of 50° C. to 200° C. at normal pressure are preferable. Examples of such a solvent include chloroform, toluene, anisole, 2-heptanone, xylene, propylene glycol monomethyl ether acetate and the like. The application solution for forming the organic semiconductor layer 4 can be applied on the gate insulation layer 3 by known application methods such as a spin coat method, a die coat method, a screen printing method, an inkjet printing method and the like, in the same manner as for the application solution for forming the insulation layer 3 previously explained.

The over coat layer 7 (protective layer) can be formed, for example, by using the polymer compound of the present invention already explained in the same manner as the production method of the gate insulation layer 3 explained previously.

Further, the under coat layer not illustrated can also be formed in the same manner as for the over coat layer 7.

The polymer compound of the present invention is excellent in preservation stability and can be hardened at lower temperatures, resultantly, when the inventive polymer compound is used, a step of forming a gate insulation layer and further a method of producing an organic thin film transistor can be carried out more simply.

<Application of Organic Thin Film Transistor>

By using the organic thin film transistor produced by using the polymer compound of the present invention, a display member containing the organic thin film transistor can be produced. Further, by using the display member containing the organic thin film transistor, a display having the display member can be produced.

The organic thin film transistor formed by using the polymer compound of the present invention can also be used for an OFET sensor. The OFET sensor is a sensor using an organic thin film transistor (organic field effect transistor: OFET) as a signal conversion element converting an input signal into an electric signal and outputting the electric signal, wherein sensitivity function or selectivity function is imparted into the structure of any of an electrode, an insulation layer and an organic semiconductor layer. The OFET sensor includes, for example, a biosensoion sensor and a humidity sensor.

For example, a biosensor has an organic thin film transistor having the constitution as described above. The organic thin film transistor has a probe (sensitive region) specifically interacting with the target substance, in a channel region and/or a gate insulation layer. When the concentration of the target substance changes, electric characteristics of the probe change, it can function as a biosensor.

As a method of detecting the target substance in a test sample, for example, biological molecules such as nucleic acids, proteins and the like or artificially synthesized functional groups are fixed to the surface of a solid phase carrier, and these are used as a probe.

In this method, the target substance is captured with a probe on the solid phase carrier by utilizing specific affinity between substances or functional groups such as an interaction of nucleic acid chains having complementary sequences, an antigen-antibody reaction, an enzyme-substrate reaction, a receptor-ligand interaction and the like. Accordingly, a substance of a functional group having specific affinity to the target substance is selected as the probe.

A probe is fixed to the surface of a solid phase carrier by a method corresponding to the kind of the selected probe and the kind of the solid phase carrier. Further, it is also possible to synthesize a probe on the surface of a solid phase carrier (for example, a probe is synthesized by a nucleic acid elongation reaction). In any case, a probe-target substance complex is formed on the surface of a solid phase carrier by contacting the probe fixed to the surface of the solid phase carrier with a test sample and treating them under suitable conditions. A channel region and/or a gate insulation layer itself of the organic thin film transistor may function as a probe.

The gas sensor has an organic thin film transistor having the constitution as described above. In the organic thin film transistor of this case, a channel region and/or a gate insulation layer functions as a gas sensitive part. When a gas to be detected contacts a gas sensitive part, electric characteristics (electric conductivity, dielectric constant and the like) of the gas sensitive part vary, thus, it can function as a gas sensor.

The gas to be detected includes, for example, an electron-accepting gas and an electron-donating gas. The electron-accepting gas includes, for example, halogen gases such as $F_2$, $Cl_2$ and the like, nitrogen oxide gases, sulfur oxide gases and gases of organic acids such as acetic acid and the like. The electron-donating gas, for example, an ammonia gas, gases of amines such as aniline and the like, a carbon monoxide gas and a hydrogen gas.

The organic thin film transistor formed by using the polymer compound of the present invention can also be used for production of a pressure sensor. The pressure sensor has an organic thin film transistor having the constitution as described above. In this case, a channel region and/or a gate insulation layer functions as a pressure sensitive part in the organic thin film transistor. When pressure is applied to the pressure sensitive part, electric characteristics of the pressure sensitive part vary, thus, it can function as a pressure sensitive sensor.

When a channel region functions as a pressure sensitive part, an organic thin film transistor may further have an orientation layer for further enhancing the crystallinity of an organic semiconductor contained in the channel region. The orientation layer includes, for example, a monomolecular layer which is provided so as to be bonded to a gate insulation layer using a silane coupling agent such as hexamethyldisilazane and the like.

Further, the organic thin film transistor formed by using the polymer compound of the present invention can also be used for production of a conductivity modulation type sensor. The conductivity modulation type sensor of the present invention uses a conductivity measuring element as a signal conversion element for converting an input signal into an electric signal and outputting the electric signal, and is a film obtained by hardening the polymer compound of the present invention or a film obtained by imparting sensitivity function or selectivity function for the input to be detected to a film obtained by hardening the polymer compound of the present invention. The conductivity modulation type sensor detects the input to be detected as a change in conductivity of the film obtained by hardening the polymer compound of the present invention. The conductivity modulation type sensor includes, for example, a biosensor, a gas sensor, an ion sensor and a humidity sensor.

Further, the organic thin film transistor formed by using the polymer compound of the present invention can also be used for production of an amplifying circuit containing an organic thin film transistor for amplifying the output signals from various sensors such as a biosensor, a gas sensor, an ion sensor, a humidity sensor, a pressure sensor and the like.

Further, the organic thin film transistor formed by using the polymer compound of the present invention can also be used for production of a sensor array having a plurality of integrated sensors such as a biosensor, a gas sensor, an ion sensor, a humidity sensor, a pressure sensor and the like.

Further, the organic thin film transistor formed by using the polymer compound of the present invention can also be used for production of a sensor array having a plurality of integrated sensors such as a biosensor, a gas sensor, an ion sensor, a humidity sensor, a pressure sensor and the like and equipped with an amplifier circuit containing an organic thin film transistor for individually amplifying the output signal from each of the sensors.

EXAMPLES

The present invention will be illustrated further in detail by examples below. The present invention is not limited to the examples described below.
(Analysis of Molecular Weight)

The number-average molecular weight and the weight-average molecular weight of a polymer compound C described later were determined using gel permeation chromatography (GPC, manufactured by Waters, trade name: Alliance GPC 2000). The polymer compound C to be measured was dissolved in ortho-dichlorobenzene, and the solution was injected into GPC. As the mobile phase of GPC, ortho-dichlorobenzene was used. As the column, "TSKgel GMHHR-H(S)HT (two columns connected, manufactured by Tosoh Corp.)" was used. As the detector, an UV detector was used.

The number-average molecular weight and the weight-average molecular weight of polymer compounds 1 to 13 were determined using gel permeation chromatography (GPC, manufactured by Tosoh Corp.). As the mobile phase of GPC, THF was used. As the column, "PLgel 10 μm MIXED-B (one column, manufactured by Agilent Technologies)" was used. As the detector, an UV detector was used.

Synthesis Example 1 (Synthesis of Polymer Compound C)

A polymer compound C was synthesized along the following scheme.

A gas in a reaction vessel was purged with a nitrogen gas, then, a compound B-1 represented by the following formula B-1 (286.8 mg, 0.200 mmol), a compound B-2 represented by the following formula B-2 (77.6 mg, 0.200 mmol), tetrahydrofuran (19 mL), tris(dibenzylideneacetone)dipalladium (7.3 mg) and tri-tert-butylphosphonium tetrafluoroborate (9.3 mg) were added and stirred. Into the resultant reaction solution was dropped 1.0 mL of a 3 mol/L potassium phosphate aqueous solution and the mixture was refluxed for 3 hours. To the resultant reaction solution was added 24.4 mg of phenylboronic acid and the mixture was refluxed for 1 hour. To the resultant reaction solution was added 0.1 g of sodium N,N-diethyldithiocarbamate trihydrate and the mixture was refluxed for 3 hours. The resultant reaction solution was poured into water, toluene was added, and the toluene layer was extracted. The resultant toluene solution was washed with an acetic acid aqueous solution and water, then, purified using a silica gel column. The resultant toluene solution was dropped into acetone, to obtain a deposit. The resultant deposit was washed by a Soxhlet extractor using acetone as a solvent, to obtain a polymer compound C containing a repeating unit represented by the following formula. The amount of the polymer compound C obtained was 244 mg, and the polymer compound C had a polystyrene-equivalent number-average molecular weight of $3.1 \times 10^4$ and a polystyrene-equivalent weight-average molecular weight of $6.5 \times 10^4$.

[chemical formula 12]

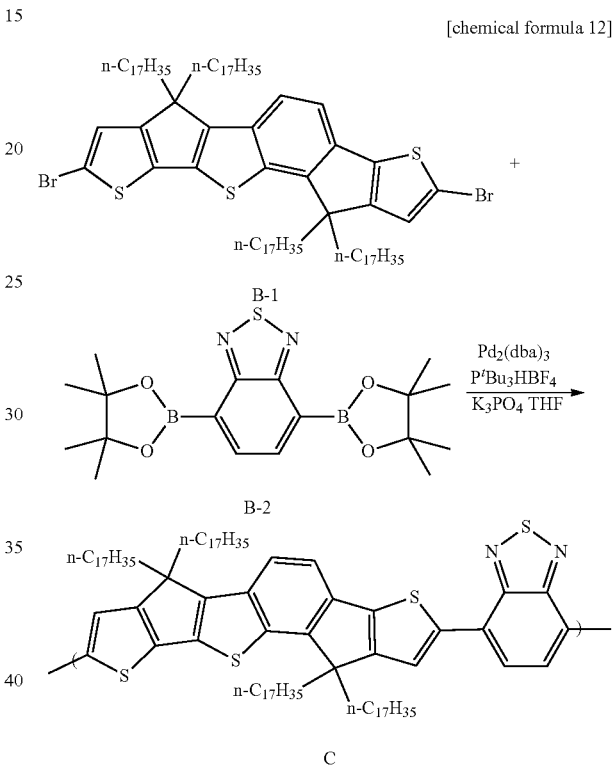

Example 1 (Synthesis of Polymer Compound (1))

2,2,2-trifluoroethyl methacrylate (manufactured by Tokyo Chemical Industry Co., Ltd.) (5.65 g), 2-[O-[1'-methylpropylideneamino]carboxyamino]ethyl methacrylate (manufactured by Showa Denko K.K., trade name "Karenz MOI-BM") (1.74 g), 4-vinylbenzoic acid (manufactured by Tokyo Chemical Industry Co., Ltd.) (1.07 g), 2,2'-azobis(2-methylpropionitrile) (0.063 g), propylene glycol monomethyl ether acetate (PGMEA) (manufactured by Tokyo Chemical Industry Co., Ltd.) (19.89 g) were placed in a 50 mL pressure resistant vessel (manufactured by ACE GLASS), bubbled with a nitrogen gas, then, the vessel was sealed tightly, and the materials were polymerized in an oil bath of 70° C. for 18 hours, to obtain a viscous PGMEA solution (composition (1)) containing the dissolved polymer compound (1) having the following repeating units and the composition. The resultant polymer compound (1) had a polystyrene-equivalent number-average molecular weight of $4.0 \times 10^4$ and a polystyrene-equivalent weight-average molecular weight of $9.7 \times 10^4$.

2,2,2-trifluoroethyl methacrylate unit:2-[O-[1'-methyl-propylideneamino]carboxyamino]ethyl methacrylate unit:4-vinylbenzoic acid unit in the polymer was 70% by mol:15% by mol:15% by mol in terms of the charge ratio thereof.

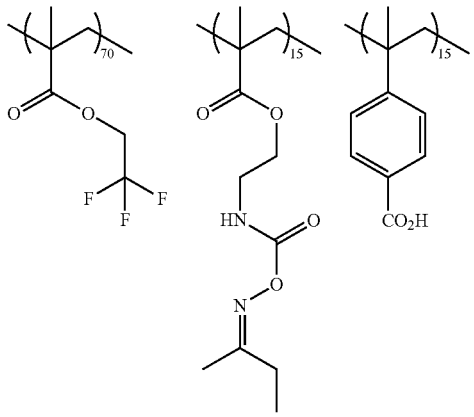

Example 2 (Synthesis of Polymer Compound (2))

2,2,2-trifluoroethyl methacrylate (manufactured by Tokyo Chemical Industry Co., Ltd.) (6.73 g), 2-[O-[1'-methylpropylideneamino]carboxyamino]ethyl methacrylate (manufactured by Showa Denko K.K., trade name "Karenz MOI-BM") (1.21 g), 4-vinylbenzoic acid (manufactured by Tokyo Chemical Industry Co., Ltd.) (6.73 g), 2,2'-azobis(2-methylpropionitrile) (0.066 g) and propylene glycol monomethyl ether acetate (PGMEA) (manufactured by Tokyo Chemical Industry Co., Ltd.) (20.40 g) were placed in a 50 mL pressure resistant vessel (manufactured by ACE GLASS), bubbled with a nitrogen gas, then, the vessel was sealed tightly, and the materials were polymerized in an oil bath of 70° C. for 16 hours, to obtain a viscous PGMEA solution containing the dissolved polymer compound (2) having the following repeating units and the composition. The resultant polymer compound (2) had a polystyrene-equivalent number-average molecular weight of $3.9 \times 10^4$ and a polystyrene-equivalent weight-average molecular weight of $9.1 \times 10^4$.

2,2,2-trifluoroethyl methacrylate unit:2-[O-[1'-methyl-propylideneamino]carboxyamino]ethyl methacrylate unit:4-vinylbenzoic acid unit in the polymer was 80% by mol:10% by mol:10% by mol in terms of the charge ratio thereof.

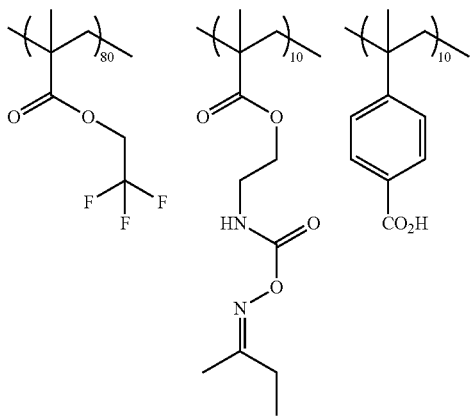

Example 3 (Synthesis of Polymer Compound (3))

2,2,2-trifluoroethyl methacrylate (manufactured by Tokyo Chemical Industry Co., Ltd.) (3.43 g), 2-[O-[1'-methylpropylideneamino]carboxyamino]ethyl methacrylate (manufactured by Showa Denko K.K., trade name "Karenz MOI-BM") (1.65 g), 2-hydroxyethyl methacrylate (manufactured by Tokyo Chemical Industry Co., Ltd.) (0.89 g), 2,2'-azobis (2-methylpropionitrile) (0.045 g) and propylene glycol monomethyl ether acetate (PGMEA) (manufactured by Tokyo Chemical Industry Co., Ltd.) (14.02 g) were placed in a 50 mL pressure resistant vessel (manufactured by ACE GLASS), bubbled with a nitrogen gas, then, the vessel was sealed tightly, and the materials were polymerized in an oil bath of 70° C. for 18 hours, to obtain a viscous PGMEA solution containing the dissolved polymer compound (3) having the following repeating units and the composition. The resultant polymer compound (3) had a polystyrene-equivalent number-average molecular weight of $3.2 \times 10^4$ and a polystyrene-equivalent weight-average molecular weight of $1.2 \times 10^5$.

2,2,2-trifluoroethyl methacrylate unit:2-[O-[1'-methyl-propylideneamino]carboxyamino]ethyl methacrylate unit:2-hydroxyethyl methacrylate unit in the polymer was 60% by mol:20% by mol:20% by mol in terms of the charge ratio thereof.

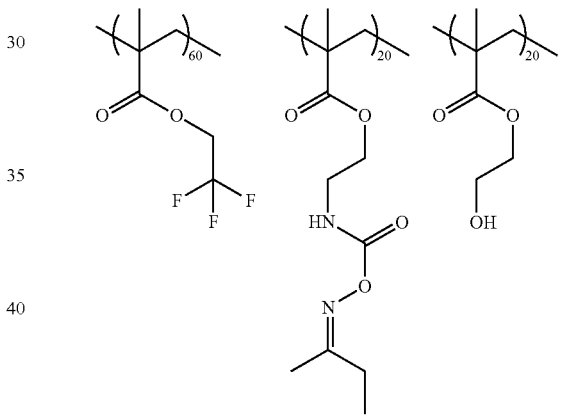

Example 4 (Synthesis of Polymer Compound (4))

2,2,2-trifluoroethyl methacrylate (manufactured by Tokyo Chemical Industry Co., Ltd.) (5.77 g), 2-[O-[1'-methylpropylideneamino]carboxyamino]ethyl methacrylate (manufactured by Showa Denko K.K., trade name "Karenz MOI-BM") (1.78 g), 2-hydroxyethyl methacrylate (manufactured by Tokyo Chemical Industry Co., Ltd.) (0.96 g), 2,2'-azobis (2-methylpropionitrile) (0.064 g) and propylene glycol monomethyl ether acetate (PGMEA) (manufactured by Tokyo Chemical Industry Co., Ltd.) (19.99 g) were placed in a 50 mL pressure resistant vessel (manufactured by ACE GLASS), bubbled with a nitrogen gas, then, the vessel was sealed tightly, and the materials were polymerized in an oil bath of 70° C. for 18 hours, to obtain a viscous PGMEA solution containing the dissolved polymer compound (4) having the following repeating units and the composition. The resultant polymer compound (4) had a polystyrene-equivalent number-average molecular weight of $3.3 \times 10^4$ and a polystyrene-equivalent weight-average molecular weight of $1.1 \times 10^5$.

2,2,2-trifluoroethyl methacrylate unit:2-[O-[1'-methylpropylideneamino]carboxyamino]ethyl methacrylate unit:2-hydroxyethyl methacrylate unit in the polymer was 70% by mol:15% by mol:15% by mol in terms of the charge ratio thereof.

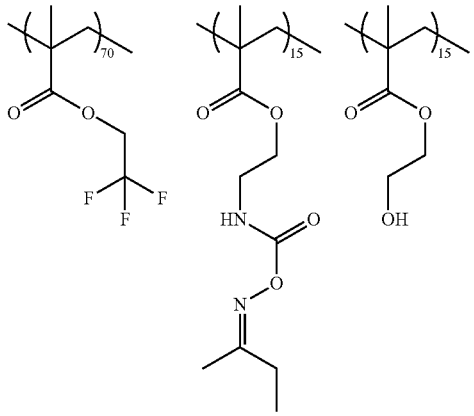

Example 5 (Synthesis of Polymer Compound (5))

2,2,2-trifluoroethyl methacrylate (manufactured by Tokyo Chemical Industry Co., Ltd.) (2.86 g), 2-[O-[1'-methylpropylideneamino]carboxyamino]ethyl methacrylate (manufactured by Showa Denko K.K., trade name "Karenz MOI-BM") (2.06 g), 2-hydroxyethyl methacrylate (manufactured by Tokyo Chemical Industry Co., Ltd.) (1.11 g), 2,2'-azobis(2-methylpropionitrile) (0.045 g) and propylene glycol monomethyl ether acetate (PGMEA) (manufactured by Tokyo Chemical Industry Co., Ltd.) (14.16 g) were placed in a 50 mL pressure resistant vessel (manufactured by ACE GLASS), bubbled with a nitrogen gas, then, the vessel was sealed tightly, and the materials were polymerized in an oil bath of 70° C. for 18 hours, to obtain a viscous PGMEA solution containing the dissolved polymer compound (5) having the following repeating units and the composition. The resultant polymer compound (5) had a polystyrene-equivalent number-average molecular weight of $3.2 \times 10^4$ and a polystyrene-equivalent weight-average molecular weight of $1.1 \times 10^5$.

2,2,2-trifluoroethyl methacrylate unit:2-[O-[1'-methylpropylideneamino]carboxyamino]ethyl methacrylate unit:2-hydroxyethyl methacrylate unit in the polymer was 50% by mol:25% by mol:25% by mol in terms of the charge ratio thereof.

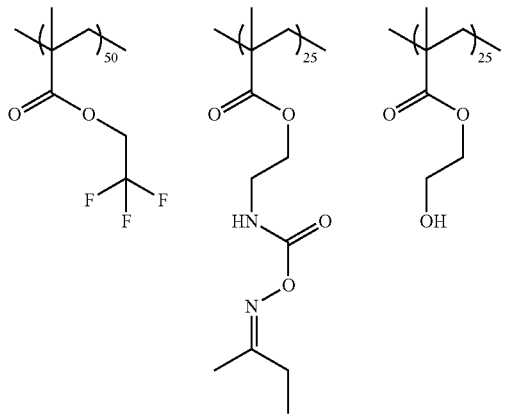

Example 6 (Synthesis of Polymer Compound (6))

2,2,2-trifluoroethyl methacrylate (manufactured by Tokyo Chemical Industry Co., Ltd.) (2.29 g), 2-[O-[1'-methylpropylideneamino]carboxyamino]ethyl methacrylate (manufactured by Showa Denko K.K., trade name "Karenz MOI-BM") (2.47 g), 2-hydroxyethyl methacrylate (manufactured by Tokyo Chemical Industry Co., Ltd.) (1.33 g), 2,2'-azobis(2-methylpropionitrile) (0.045 g) and propylene glycol monomethyl ether acetate (PGMEA) (manufactured by Tokyo Chemical Industry Co., Ltd.) (14.30 g) were placed in a 50 mL pressure resistant vessel (manufactured by ACE GLASS), bubbled with a nitrogen gas, then, the vessel was sealed tightly, and the materials were polymerized in an oil bath of 70° C. for 18 hours, to obtain a viscous PGMEA solution containing the dissolved polymer compound (1) having the following repeating units and the composition. The resultant polymer compound (1) had a polystyrene-equivalent number-average molecular weight of $3.2 \times 10^4$ and a polystyrene-equivalent weight-average molecular weight of $9.8 \times 10^4$.

2,2,2-trifluoroethyl methacrylate unit:2-[O-[1'-methylpropylideneamino]carboxyamino]ethyl methacrylate unit:2-hydroxyethyl methacrylate unit in the polymer was 40% by mol:30% by mol:30% by mol in terms of the charge ratio thereof.

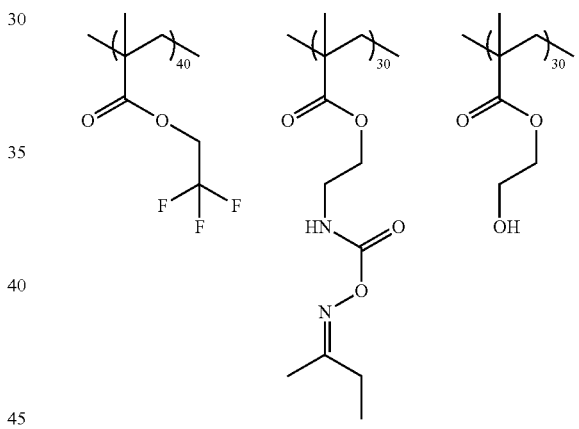

Comparative Example 1 (Synthesis of Polymer Compound (7))

2,2,2-trifluoroethyl methacrylate (manufactured by Tokyo Chemical Industry Co., Ltd.) (1.66 g), 2-[O-[1'-methylpropylideneamino]carboxyamino]ethyl methacrylate (manufactured by Showa Denko K.K., trade name "Karenz MOI-BM") (2.80 g), 2-hydroxyethyl methacrylate (manufactured by Tokyo Chemical Industry Co., Ltd.) (1.50 g), 2,2'-azobis(2-methylpropionitrile) (0.043 g) and propylene glycol monomethyl ether acetate (PGMEA) (manufactured by Tokyo Chemical Industry Co., Ltd.) (14.02 g) were placed in a 50 mL pressure resistant vessel (manufactured by ACE GLASS), bubbled with a nitrogen gas, then, the vessel was sealed tightly, and the materials were polymerized in an oil bath of 70° C. for 18 hours, to obtain a viscous PGMEA solution containing the dissolved polymer compound (7) having the following repeating units and the composition. The resultant polymer compound (7) had a polystyrene-equivalent number-average molecular weight of $2.8\times10^4$ and a polystyrene-equivalent weight-average molecular weight of $6.7\times10^4$.

2,2,2-trifluoroethyl methacrylate unit:2-[O-[1'-methyl-propylideneamino]carboxyamino]ethyl methacrylate unit:2-hydroxyethyl methacrylate unit in the polymer was 30% by mol:35% by mol:35% by mol in terms of the charge ratio thereof.

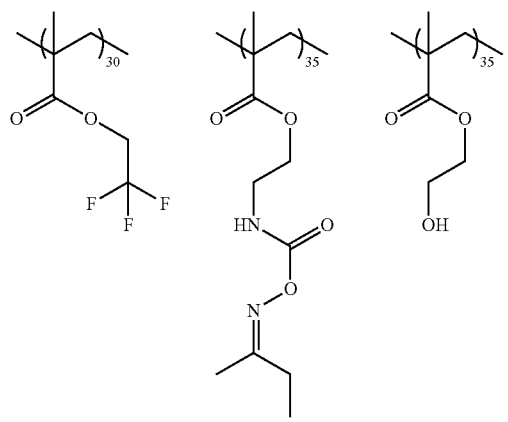

Example 7 (Synthesis of Polymer Compound (8))

2,2,2-trifluoroethyl methacrylate (manufactured by Tokyo Chemical Industry Co., Ltd.) (3.95 g), styrene (manufactured by Junsei Chemical Co., Ltd.) (0.98 g), 2-[O-[1'-methylpropylideneamino]carboxyamino]ethyl methacrylate (manufactured by Showa Denko K.K., trade name "Karenz MOI-BM") (1.71 g), 2-hydroxyethyl methacrylate (manufactured by Tokyo Chemical Industry Co., Ltd.) (0.92 g), 2,2'-azobis(2-methylpropionitrile) (0.062 g) and propylene glycol monomethyl ether acetate (PGMEA) (manufactured by Tokyo Chemical Industry Co., Ltd.) (17.77 g) were placed in a 50 mL pressure resistant vessel (manufactured by ACE GLASS), bubbled with a nitrogen gas, then, the vessel was sealed tightly, and the materials were polymerized in an oil bath of 70° C. for 19 hours, to obtain a viscous PGMEA solution containing the dissolved polymer compound (8) having the following repeating units and the composition. The resultant polymer compound (8) had a polystyrene-equivalent number-average molecular weight of $3.5\times10^4$ and a polystyrene-equivalent weight-average molecular weight of $8.3\times10^4$.

2,2,2-trifluoroethyl methacrylate unit:styrene unit:2-[O-[1'-methylpropylideneamino]carboxyamino]ethyl methacrylate unit:2-hydroxyethyl methacrylate unit in the polymer was 50% by mol:20% by mol:15% by mol:15% by mol in terms of the charge ratio thereof.

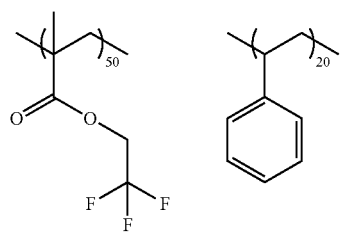

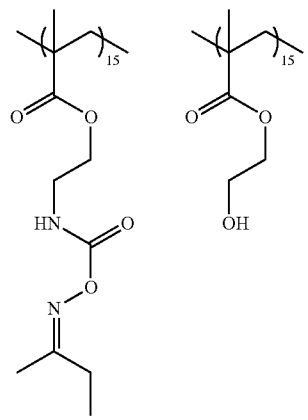

Example 8 (Synthesis of Polymer Compound (9))

2,2,2-trifluoroethyl methacrylate (manufactured by Tokyo Chemical Industry Co., Ltd.) (3.36 g), styrene (manufactured by Junsei Chemical Co., Ltd.) (1.56 g), 2-[O-[1'-methylpropylideneamino]carboxyamino]ethyl methacrylate (manufactured by Showa Denko K.K., trade name "Karenz MOI-BM") (1.82 g), 2-hydroxyethyl methacrylate (manufactured by Tokyo Chemical Industry Co., Ltd.) (0.98 g), 2,2'-azobis(2-methylpropionitrile) (0.066 g) and propylene glycol monomethyl ether acetate (PGMEA) (manufactured by Tokyo Chemical Industry Co., Ltd.) (18.16 g) were placed in a 50 mL pressure resistant vessel (manufactured by ACE GLASS), bubbled with a nitrogen gas, then, the vessel was sealed tightly, and the materials were polymerized in an oil bath of 70° C. for 19 hours, to obtain a viscous PGMEA solution containing the dissolved polymer compound (9) having the following repeating units and the composition. The resultant polymer compound (9) had a polystyrene-equivalent number-average molecular weight of $3.6\times10^4$ and a polystyrene-equivalent weight-average molecular weight of $8.0\times10^4$.

2,2,2-trifluoroethyl methacrylate unit:styrene unit:2-[O-[1'-methylpropylideneamino]carboxyamino]ethyl methacrylate unit:2-hydroxyethyl methacrylate unit in the polymer was 40% by mol:30% by mol:15% by mol:15% by mol in terms of the charge ratio thereof.

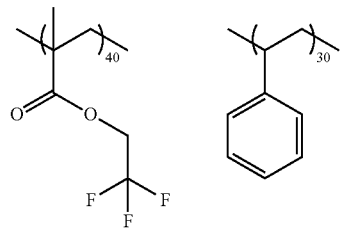

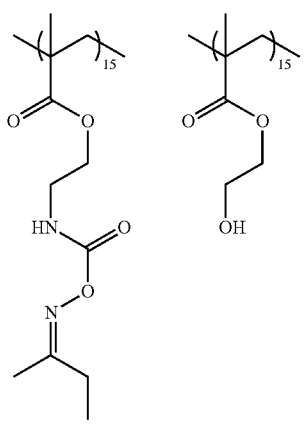

Example 9 (Synthesis of Polymer Compound (10))

2,2,2-trifluoroethyl methacrylate (manufactured by Tokyo Chemical Industry Co., Ltd.) (4.71 g), methyl methacrylate (manufactured by Wako Pure Chemical Industries, Ltd.) (1.17 g), 2-[O-[1'-methylpropylideneamino]carboxyamino]ethyl methacrylate (manufactured by Showa Denko K.K., trade name "Karenz MOI-BM") (2.04 g), 2-hydroxyethyl methacrylate (manufactured by Tokyo Chemical Industry Co., Ltd.) (1.09 g), 2,2'-azobis(2-methylpropionitrile) (0.074 g) and propylene glycol monomethyl ether acetate (PGMEA) (manufactured by Tokyo Chemical Industry Co., Ltd.) (21.18 g) were placed in a 50 mL pressure resistant vessel (manufactured by ACE GLASS), bubbled with a nitrogen gas, then, the vessel was sealed tightly, and the materials were polymerized in an oil bath of 70° C. for 19 hours, to obtain a viscous PGMEA solution containing the dissolved polymer compound (10) having the following repeating units and the composition. The resultant polymer compound (10) had a polystyrene-equivalent number-average molecular weight of $3.5 \times 10^4$ and a polystyrene-equivalent weight-average molecular weight of $1.0 \times 10^5$.

2,2,2-trifluoroethyl methacrylate unit:methyl methacrylate unit:2-[O-[1'-methylpropylideneamino]carboxyamino]ethyl methacrylate unit:2-hydroxyethyl methacrylate unit in the polymer was 50% by mol:20% by mol:15% by mol:15% by mol in terms of the charge ratio thereof.

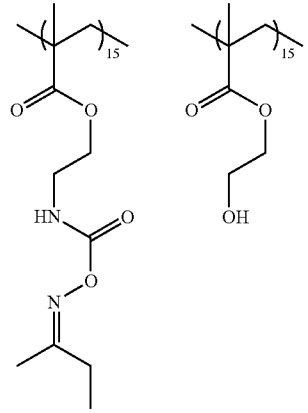

Example 10 (Synthesis of Polymer Compound (11))

2,2,2-trifluoroethyl methacrylate (manufactured by Tokyo Chemical Industry Co., Ltd.) (4.04 g), styrene (manufactured by Junsei Chemical Co., Ltd.) (5.00 g), 2-[O-[1'-methylpropylideneamino]carboxyamino]ethyl methacrylate (manufactured by Showa Denko K.K., trade name "Karenz MOI-BM") (0.97 g), 4-hydroxybutyl acrylate (manufactured by Nihon Kasei Co., Ltd.) 0.58 g, 2,2'-azobis(2-methylpropionitrile) (0.053 g) and 2-heptanone (MAKN) (manufactured by Tokyo Chemical Industry Co., Ltd.) (15.95 g) were placed in a 50 mL pressure resistant vessel (manufactured by ACE GLASS), bubbled with a nitrogen gas, then, the vessel was sealed tightly, and the materials were polymerized in an oil bath of 70° C. for 18 hours, to obtain a viscous MAKN solution containing the dissolved polymer compound (11) having the following repeating units and the composition. The resultant polymer compound (11) had a polystyrene-equivalent number-average molecular weight of $3.4 \times 10^4$ and a polystyrene-equivalent weight-average molecular weight of $6.5 \times 10^4$.

2,2,2-trifluoroethyl methacrylate unit:styrene unit:2-[O-[1'-methylpropylideneamino]carboxyamino]ethyl methacrylate unit:4-hydroxybutyl acrylate unit in the polymer was 30% by mol:60% by mol:5% by mol:5% by mol in terms of the charge ratio thereof.

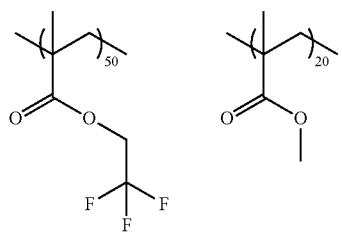

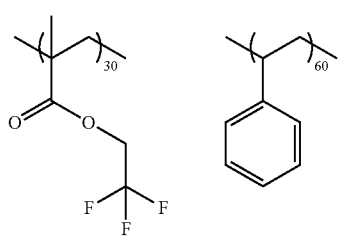

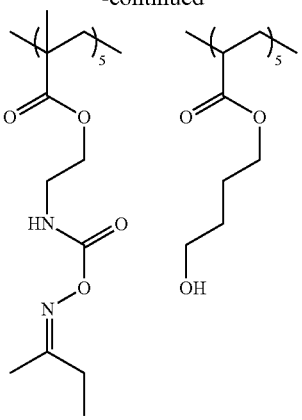

Example 11 (Synthesis of Polymer Compound (12))

2,2,2-trifluoroethyl methacrylate (manufactured by Tokyo Chemical Industry Co., Ltd.) (1.56 g), 2-[O-[1'-methylpropylideneamino]carboxyamino]ethyl methacrylate (manufactured by Showa Denko K.K., trade name "Karenz MOI-BM") (3.76 g), hydroxypropyl acrylate (manufactured by Tokyo Chemical Industry Co., Ltd.) 0.81 g, 2,2'-azobis(2-methylpropionitrile) (0.041 g) and propylene glycol monomethyl ether acetate (PGMEA) (manufactured by Tokyo Chemical Industry Co., Ltd.) (14.39 g) were placed in a 50 mL pressure resistant vessel (manufactured by ACE GLASS), bubbled with a nitrogen gas, then, the vessel was sealed tightly, and the materials were polymerized in an oil bath of 70° C. for 19 hours, to obtain a viscous PGMEA solution containing the dissolved polymer compound (12) having the following repeating units and the composition. The resultant polymer compound (12) had a polystyrene-equivalent number-average molecular weight of $3.1 \times 10^4$ and a polystyrene-equivalent weight-average molecular weight of $8.4 \times 10^4$.

2,2,2-trifluoroethyl methacrylate unit:2-[O-[1'-methylpropylideneamino]carboxyamino]ethyl methacrylate unit:hydroxypropyl acrylate unit in the polymer was 40% by mol:30% by mol:30% by mol in terms of the charge ratio thereof.

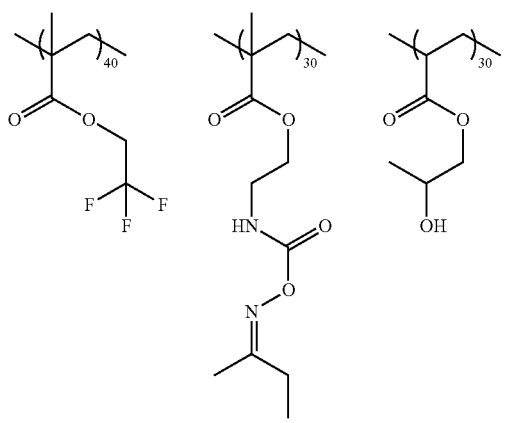

Comparative Example 2 (Synthesis of Polymer Compound (13))

2,2,2-trifluoroethyl methacrylate (manufactured by Tokyo Chemical Industry Co., Ltd.) (1.56 g), 2-[O-[1'-methylpropylideneamino]carboxyamino]ethyl methacrylate (manufactured by Showa Denko K.K., trade name "Karenz MOI-BM") (2.63 g), hydroxypropyl acrylate (manufactured by Tokyo Chemical Industry Co., Ltd.) (1.41 g), 2,2'-azobis(2-methylpropionitrile) (0.041 g) and propylene glycol monomethyl ether acetate (PGMEA) (manufactured by Tokyo Chemical Industry Co., Ltd.) (13.17 g) were placed in a 50 mL pressure resistant vessel (manufactured by ACE GLASS), bubbled with a nitrogen gas, then, the vessel was sealed tightly, and the materials were polymerized in an oil bath of 70° C. for 17 hours, to obtain a viscous PGMEA solution containing the dissolved polymer compound (12) having the following repeating units and the composition. The resultant polymer compound (12) had a polystyrene-equivalent number-average molecular weight of $2.7 \times 10^4$ and a polystyrene-equivalent weight-average molecular weight of $6.9 \times 10^4$.

2,2,2-trifluoroethyl methacrylate unit:2-[O-[1'-methylpropylideneamino]carboxyamino]ethyl methacrylate unit:hydroxypropyl acrylate unit in the polymer was 30% by mol:35% by mol:35% by mol in terms of the charge ratio thereof.

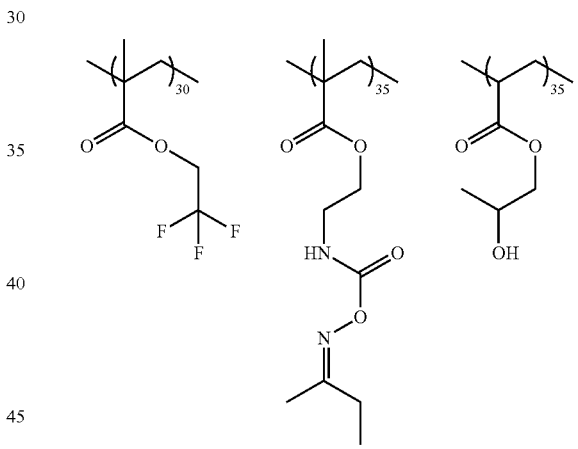

Comparative Example 3 (Synthesis of Polymer Compound (14))

2,2,2-trifluoroethyl methacrylate (manufactured by Tokyo Chemical Industry Co., Ltd.) (2.35 g), styrene (manufactured by Junsei Chemical Co., Ltd.) (1.82 g), 2-[O-[1'-methylpropylideneamino]carboxyamino]ethyl methacrylate (manufactured by Showa Denko K.K., trade name "Karenz MOI-BM") (0.85 g), 2,2'-azobis(2-methylpropionitrile) (0.046 g) and 2-heptanone (MAKN) (manufactured by Tokyo Chemical Industry Co., Ltd.) (11.83 g) were placed in a 50 mL pressure resistant vessel (manufactured by ACE GLASS), bubbled with a nitrogen gas, then, the vessel was sealed tightly, and the materials were polymerized in an oil bath of 60° C. for 17 hours, to obtain a viscous MAKN solution containing the dissolved polymer compound (14) having the following repeating units and the composition. The resultant polymer compound (14) had a polystyrene-equivalent number-average molecular weight of 3.9×10⁴ and a polystyrene-equivalent weight-average molecular weight of 7.2×10⁴.

2,2,2-trifluoroethyl methacrylate unit:styrene unit:2-[O-[1'-methylpropylideneamino]carboxyamino]ethyl methacrylate unit in the polymer was 40% by mol:50% by mol:10% by mol in terms of the charge ratio thereof.

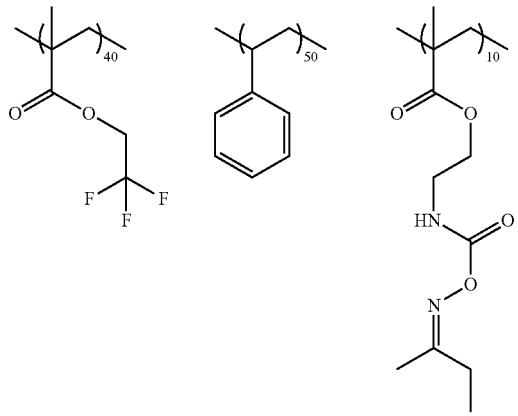

Comparative Example 4 (Synthesis of Polymer Compound (15))

2,3,4,5,6-pentafluorostyrene (manufactured by Aldrich) (9.51 g), 4-aminostyrene (manufactured by Tokyo Chemical Industry Co., Ltd.) (2.50 g), 2,2'-azobis(2-methylpropionitrile) (0.092 g) and 2-heptanone (MAKN) (manufactured by Tokyo Chemical Industry Co., Ltd.) (18.16 g) were placed in a 50 mL pressure resistant vessel (manufactured by ACE GLASS), bubbled with a nitrogen gas, then, the vessel was sealed tightly, and the materials were polymerized in an oil bath of 60° C. for 17 hours, to obtain a viscous MAKN solution containing the dissolved polymer compound (15) having the following repeating units and the composition. The resultant polymer compound (15) had a polystyrene-equivalent number-average molecular weight of 3.9×10⁴ and a polystyrene-equivalent weight-average molecular weight of 7.2×10⁴.

2,3,4,5,6-pentafluorostyrene unit:4-aminostyrene unit in the polymer was 70% by mol:30% by mol in terms of the charge ratio thereof.

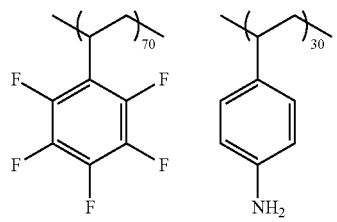

Example 12 (Production and Evaluation of Organic Thin Film Transistor (1))

A bottom gate bottom contact type organic thin film transistor device (1) (referred to as transistor (1) in some cases, the same shall apply hereinafter) was produced using a PGMEA solution (composition (1)) of the polymer compound (1) obtained in Example 1 and a solution containing the polymer compound C. Specific explanations will be made below.

The chromium (Cr) layer formed on the glass substrate was patterned by a photolithography step and an etching step, to form a gate electrode.

Subsequently, the composition (1) was applied by a spin coat method on the side of the gate electrode of the glass substrate on which the gate electrode had been formed and the applied layer formed was heat-treated at 180° C. for 30 minutes, to form a gate insulation layer as a hardened film obtained by hardening the applied layer of the composition (1). The thickness of the gate insulation layer formed was 1167 nm.

Next, a layer of gold was patterned by a vapor deposition method on the side of the gate insulation layer of the glass substrate on which the gate insulation layer had been formed, to form a source electrode and a drain electrode.

Next, the glass substrate on which the source electrode and the drain electrode had been formed was immersed in an isopropyl alcohol diluted solution of pentafluorobenzenethiol for 2 minutes, to modify the surface of the source electrode and the drain electrode formed on the glass substrate. Subsequently, a 0.5% by weight polymer compound C toluene solution was spin-coated on the side of the source electrode and the drain electrode and heat-treated at 120° C. for 30 minutes using a hot plate, to form an organic semiconductor layer, thus, an organic thin film transistor (1) was obtained. The organic thin film transistor (1) produced had a channel length of 80 μm and a channel width of 2 mm.

The resultant organic thin film transistor (1) was evaluated. Specifically, voltage was applied to the gate electrode of the organic thin film transistor (1), and its transistor property was measured using a vacuum prober (BCT22MDC-5-HT-SCU; manufactured by Nagase Electronic Equipments Service Co., LTD) under conditions of changing the gate voltage Vg between 20 V and −40 V and changing the source-drain voltage Vsd between 0 V and −40 V, and evaluated. The results are shown in Table 1 below.

The carrier mobility of the organic thin film transistor (1) was 0.48 cm²/Vs.

Example 13 (Production and Evaluation of Organic Thin Film Transistor (2))

A bottom gate bottom contact type organic thin film transistor (2) was produced and the transistor property thereof was measured and evaluated in the same manner as in Example 12 except that a PGMEA solution of the polymer compound (2) obtained in Example 2 was used for formation of a gate insulation layer. The results are shown in Table 1 below.

The thickness of the gate insulation layer formed was 981 nm. The carrier mobility of the resultant organic thin film transistor (2) was 0.94 cm²/Vs.

Example 14 (Production and Evaluation of Organic Thin Film Transistor (3))

A bottom gate bottom contact type organic thin film transistor (3) was produced and the transistor property thereof was measured and evaluated in the same manner as in Example 12 except that a PGMEA solution of the polymer compound (3) obtained in Example 3 was used for formation of a gate insulation layer. The results are shown in Table 1 below.

Example 15 (Production and Evaluation of Organic Thin Film Transistor (4))

A bottom gate bottom contact type organic thin film transistor (4) was produced and the transistor property thereof was measured and evaluated in the same manner as in Example 12 except that a PGMEA solution of the polymer compound (4) obtained in Example 4 was used for formation of a gate insulation layer. The results are shown in Table 1 below.

The thickness of the gate insulation layer formed was 996 nm. The carrier mobility of the resultant organic thin film transistor (4) was 0.80 cm$^2$/Vs.

Example 16 (Production and Evaluation of Organic Thin Film Transistor (5))

A bottom gate bottom contact type organic thin film transistor (5) was produced and the transistor property thereof was measured and evaluated in the same manner as in Example 12 except that a PGMEA solution of the polymer compound (5) obtained in Example 5 was used for formation of a gate insulation layer. The results are shown in Table 1 below.

The thickness of the gate insulation layer formed was 1000 nm. The carrier mobility of the resultant organic thin film transistor (5) was 0.51 cm$^2$/Vs.

Example 17 (Production and Evaluation of Organic Thin Film Transistor (6))

A bottom gate bottom contact type organic thin film transistor (6) was produced and the transistor property thereof was measured and evaluated in the same manner as in Example 12 except that a PGMEA solution of the polymer compound (6) obtained in Example 6 was used for formation of a gate insulation layer. The results are shown in Table 1 below.

The thickness of the gate insulation layer formed was 1017 nm. The carrier mobility of the resultant organic thin film transistor (6) was 0.49 cm$^2$/Vs.

Comparative Example 5 (Production and Evaluation of Organic Thin Film Transistor (7))

A bottom gate bottom contact type organic thin film transistor (7) was produced and the transistor property thereof was measured and evaluated in the same manner as in Example 12 except that a PGMEA solution of the polymer compound (7) obtained in Comparative Example 1 was used for formation of a gate insulation layer. The results are shown in Table 1 below.

The thickness of the gate insulation layer formed was 959 nm. The carrier mobility of the resultant organic thin film transistor (7) was 0.33 cm$^2$/Vs.

Example 18 (Production and Evaluation of Organic Thin Film Transistor (8))

A bottom gate bottom contact type organic thin film transistor (8) was produced and the transistor property thereof was measured and evaluated in the same manner as in Example 12 except that a PGMEA solution of the polymer compound (8) obtained in Example 7 was used for formation of a gate insulation layer. The results are shown in Table 1 below.

The thickness of the gate insulation layer formed was 1034 nm. The carrier mobility of the resultant organic thin film transistor (8) was 0.55 cm$^2$/Vs.

Example 19 (Production and Evaluation of Organic Thin Film Transistor (9))

A bottom gate bottom contact type organic thin film transistor (9) was produced and the transistor property thereof was measured and evaluated in the same manner as in Example 12 except that a PGMEA solution of the polymer compound (9) obtained in Example 8 was used for formation of a gate insulation layer. The results are shown in Table 1 below.

The thickness of the gate insulation layer formed was 1009 nm. The carrier mobility of the resultant organic thin film transistor (9) was 0.66 cm$^2$/Vs.

Example 20 (Production and Evaluation of Organic Thin Film Transistor (10))

A bottom gate bottom contact type organic thin film transistor (10) was produced and the transistor property thereof was measured and evaluated in the same manner as in Example 12 except that a PGMEA solution of the polymer compound (10) obtained in Example 9 was used for formation of a gate insulation layer. The results are shown in Table 1 below.

The thickness of the gate insulation layer formed was 1030 nm. The carrier mobility of the resultant organic thin film transistor (10) was 0.47 cm$^2$/Vs.

Example 21 (Production and Evaluation of Organic Thin Film Transistor (11))

A bottom gate bottom contact type organic thin film transistor (11) was produced and the transistor property thereof was measured and evaluated in the same manner as in Example 12 except that an MAKN solution of the polymer compound (11) obtained in Example 10 was used for formation of a gate insulation layer. The results are shown in Table 1 below.

The thickness of the gate insulation layer formed was 1009 nm. The carrier mobility of the resultant organic thin film transistor (11) was 0.49 cm$^2$/Vs.

Example 22 (Production and Evaluation of Organic Thin Film Transistor (12))

A bottom gate bottom contact type organic thin film transistor (12) was produced and the transistor property thereof was measured and evaluated in the same manner as in Example 12 except that a PGMEA solution of the polymer compound (12) obtained in Example 11 was used for formation of a gate insulation layer. The results are shown in Table 1 below.

The thickness of the gate insulation layer formed was 1028 nm. The carrier mobility of the resultant organic thin film transistor (12) was 0.38 cm$^2$/Vs.

Comparative Example 6 (Production and Evaluation of Organic Thin Film Transistor (13))

A bottom gate bottom contact type organic thin film transistor (13) was produced and the transistor property thereof was measured and evaluated in the same manner as in Example 12 except that a PGMEA solution of the polymer compound (13) obtained in Comparative Example 2 was used for formation of a gate insulation layer. The results are shown in Table 1 below.

The thickness of the gate insulation layer formed was 1000 nm. The carrier mobility of the resultant organic thin film transistor (13) was 0.26 cm$^2$/Vs.

Comparative Example 7 (Production and Evaluation of Organic Film Transistor (14))

A 2-heptanone solution (4.00 g) of the polymer compound (14) obtained in Comparative Example 3, a 2-heptanone solution (1.20 g) of the polymer compound (15) obtained in Comparative Example 4 and 2-heptanone (3.20 g) were charged in a 20 mL sample bottle and dissolved with stirring, to prepare a uniform application solution (2).

A bottom gate bottom contact type organic thin film transistor (14) was produced and the transistor property thereof was measured and evaluated in the same manner as in Example 12 except that the application solution (2) was used for formation of a gate insulation layer. The results are shown in Table 1.

The thickness of the gate insulation layer formed was 1026 nm. The carrier mobility of the resultant organic thin film transistor (14) was 0.30 cm$^2$/Vs.

TABLE 1

| | transistor | carrier mobility (cm$^2$/Vs) |
|---|---|---|
| Example 12 | transistor (1) | 0.48 |
| Example 13 | transistor (2) | 0.94 |
| Example 14 | transistor (3) | 0.57 |
| Example 15 | transistor (4) | 0.80 |
| Example 16 | transistor (5) | 0.51 |
| Example 17 | transistor (6) | 0.49 |
| Comparative Example 5 | transistor (7) | 0.33 |
| Example 18 | transistor (8) | 0.55 |
| Example 19 | transistor (9) | 0.66 |
| Example 20 | transistor (10) | 0.47 |
| Example 21 | transistor (11) | 0.49 |
| Example 22 | transistor (12) | 0.38 |
| Comparative Example 6 | transistor (13) | 0.26 |
| Comparative Example 7 | transistor (14) | 0.30 |

INDUSTRIAL APPLICABILITY

If the polymer compound of the present invention is used, the carrier mobility of an organic thin film transistor can be further improved.

EXPLANATION OF NUMERALS

1: substrate
2: gate electrode
3: gate insulation layer
4: organic semiconductor layer
5: source electrode
6: drain electrode
7: over coat layer
10: organic thin film transistor

The invention claimed is:
1. A polymer compound comprising
a repeating unit having at least one group selected from the group consisting of a blocked isocyanato group and a blocked isothiocyanato group,
a repeating unit having at least one group selected from the group consisting of a hydroxy group and a carboxy group and
a repeating unit represented by the following formula (1), wherein
the content of the repeating unit having at least one group selected from the group consisting of a blocked isocyanato group and a blocked isothiocyanato group in the polymer compound is 1% by mol or more and 30% by mol or less when the total content of all repeating units contained in said polymer compound is taken as 100% by mol:

[chemical formula 1]

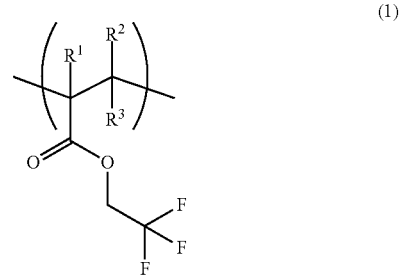

(1)

in the formula (1), $R^1$, $R^2$ and $R^3$ each independently represent a hydrogen atom or a methyl group.

2. The polymer compound according to claim 1, wherein the content of said repeating unit represented by the formula (1) is 40% by mol or more when the total content of all repeating units contained in said polymer compound is taken as 100% by mol.

3. The polymer compound according to claim 1, wherein said repeating unit having at least one group selected from the group consisting of a hydroxy group and a carboxy group is a repeating unit represented by the following formula (2):

[chemical formula 2]

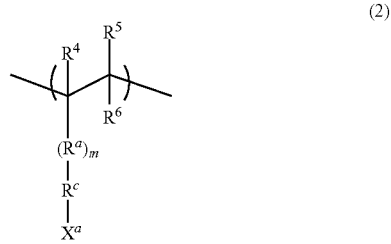

(2)

in the formula (2),
$R^4$, $R^5$ and $R^6$ each independently represent a hydrogen atom, a fluorine atom or a monovalent organic group having a number of carbon atoms of 1 to 20,
$R^a$ represents a divalent organic group having a number of carbon atoms of 1 to 20, a group represented by —O—, a group represented by —CO—, a group represented by —COO—, a group represented by —NHCO— or a group represented by —NHCOO—; a connecting bond of said group represented by —O—, said group represented by —CO—, said group represented by —COO—, said group represented by —NHCO— and said group represented by —NHCOO— may be located on the carbon atom side to which said $R^4$ is bonded in said formula (2) or may be located on the $R^c$ side in said formula (2), $R^c$ represents a single bond or a divalent organic group having a number of carbon atoms of 1 to 20, a hydrogen atom in said divalent organic group may be substituted with a fluorine atom, m represents an integer of 0 to 6, $X^a$ represents a hydroxy group or a carboxy group, and when a plurality of $R^a$ are present, they are independent of each other.

4. The polymer compound according to claim 1, wherein said blocked isocyanato group and said blocked isothiocyanato group are each a group represented by the following formula (3) or a group represented by the following formula (4):

[chemical formula 3]

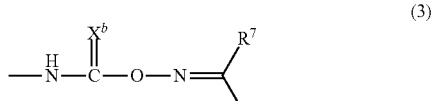
(3)

[chemical formula 4]

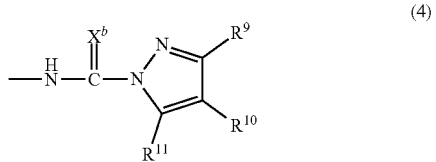
(4)

in the formulae (3) and (4), $X^b$ represents an oxygen atom or a sulfur atom and $R^7$ to $R^{11}$ each independently represent a hydrogen atom or a monovalent organic group having a number of carbon atoms of 1 to 20.

5. The polymer compound according to claim 1, further comprising a repeating unit represented by the following formula (5): [chemical formula 5]

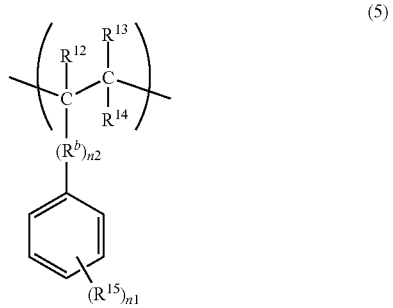
(5)

in the formula (5), $R^{12}$, $R^{13}$ and $R^{14}$ each independently represent a hydrogen atom, a fluorine atom or a monovalent organic group having a number of carbon atoms of 1 to 20, $R^{15}$ represents a chlorine atom, a fluorine atom, a bromine atom, an iodine atom or a monovalent organic group having a number of carbon atoms of 1 to 20, $R^b$ represents a divalent organic group having a number of carbon atoms of 1 to 20, a group represented by —O—, a group represented by —CO—, a group represented by —COO—, a group represented by —NHCO— or a group represented by —NHCOO—; a connecting bond of said group represented by —O—, said group represented by —CO—, said group represented by —COO—, said group represented by —NHCO— and said group represented by —NHCOO— may be located on the carbon atom side to which said $R^{12}$ is bonded in said formula (5) or may be located on the carbon atom side constituting a benzene ring in said formula (5); a hydrogen atom in said divalent organic group may be substituted with a fluorine atom, n1 represents an integer of 0 to 5, n2 represents an integer of 0 to 6, when a plurality of $R^b$ are present, they are independent of each other, and when a plurality of $R^{15}$ are present, they are independent of each other.

6. A composition comprising the polymer compound according to claim 1 and an organic solvent.

7. A film obtained by hardening the polymer compound according to claim 1.

8. An electronic device comprising the film according to claim 7.

9. An organic thin film transistor comprising the film according to claim 7 as a gate insulation layer.

10. The organic thin film transistor according to claim 9, further comprising an overcoat layer, the overcoat comprising a film obtained by hardening a polymer compound comprising a repeating unit having at least one group selected from the group consisting of a blocked isocyanato group and a blocked isothiocyanato group, a repeating unit having at least one group selected from the group consisting of a hydroxy group and a carboxy group and a repeating unit represented by the following formula (1), wherein the content of the repeating unit having at least one group selected from the group consisting of a blocked isocyanato group and a blocked isothiocyanato group in the polymer compound is 1% by mol or more and 30% by mol or less when the total content of all repeating units contained in said polymer compound is taken as 100% by mol:

[chemical formula 1]

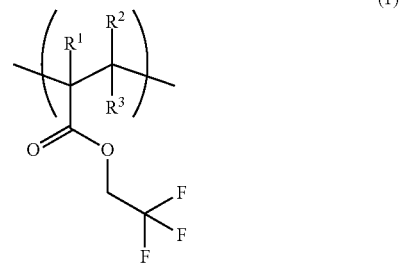
(1)

in the formula (1), $R^1$, $R^2$ and $R^3$ each independently represent a hydrogen atom or a methyl group.

* * * * *